United States Patent
Shimizu et al.

(10) Patent No.: US 8,736,346 B2
(45) Date of Patent: May 27, 2014

(54) LEVEL SHIFT CIRCUIT

(75) Inventors: Yuui Shimizu, Kanagawa (JP); Masaru Koyanagi, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 13/524,391

(22) Filed: Jun. 15, 2012

(65) Prior Publication Data

US 2013/0027108 A1 Jan. 31, 2013

(30) Foreign Application Priority Data

Jul. 26, 2011 (JP) .................................. 2011-163450

(51) Int. Cl.
*H03L 5/00* (2006.01)
(52) U.S. Cl.
USPC .......................... 327/333; 326/81; 365/189.11
(58) Field of Classification Search
USPC ..................... 327/333; 326/62, 63, 68, 80, 81; 365/189.11
See application file for complete search history.

(56) References Cited

U.S. PATENT DOCUMENTS 5,399,915 A * 3/1995 Yahata ........................... 327/108
5,781,481 A * 7/1998 Iwakiri ..................... 365/189.11
8,598,934 B2 * 12/2013 Otani et al. ..................... 327/333
2004/0085092 A1 5/2004 Aoki
2005/0174158 A1 * 8/2005 Khan et al. ..................... 327/333
2012/0038611 A1 * 2/2012 Otani et al. ..................... 345/211

FOREIGN PATENT DOCUMENTS

| JP | 2000-244306 A | 9/2000 |
|----|---------------|--------|
| JP | 2004-153689 A | 5/2004 |
| JP | 2007-329818 A | 12/2007 |
| JP | 2009-123256 A | 6/2009 |
| JP | 2011-119865   | 6/2011 |

OTHER PUBLICATIONS

Office Action issued Feb. 4, 2014, in Japanese Patent Application No. 2011-163450, filed Jul. 26, 2011 (with English-language Translation).

* cited by examiner

*Primary Examiner* — William Hernandez
(74) *Attorney, Agent, or Firm* — Oblon, Spivak, McClelland, Maier & Neustadt, L.L.P.

(57) ABSTRACT

According to one embodiment, a level shift circuit includes a plurality of level shift units which are connected to each other and in which the delay time of the rising edge of an output voltage is different from the delay time of the falling edge of the output voltage. The delay time of the rising edge of the output voltage from the previous level shift unit is compensated by the delay time of the falling edge of the output voltage from the next level shift unit, and the delay time of the falling edge of the output voltage from the previous level shift unit is compensated by the delay time of the rising edge of the output voltage from the next level shift unit.

18 Claims, 18 Drawing Sheets

FIG. 16A
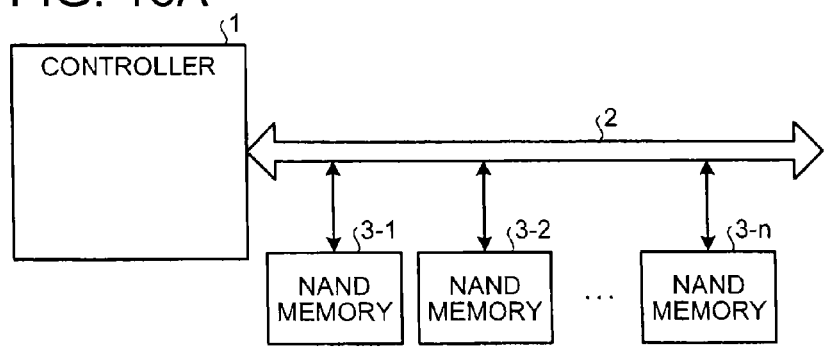
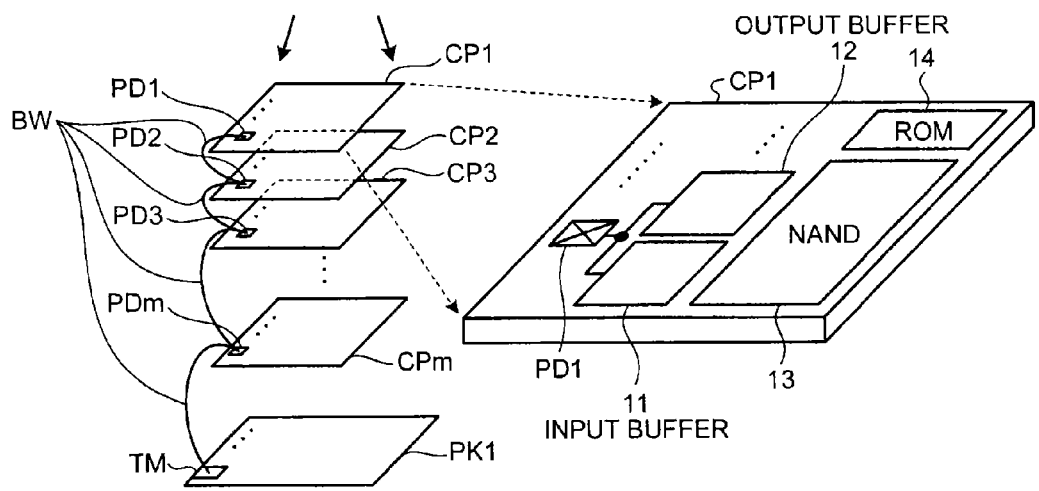
FIG. 16B    FIG. 16C

US 8,736,346 B2

LEVEL SHIFT CIRCUIT

CROSS-REFERENCE TO RELATED APPLICATIONS

This application is based upon and claims the benefit of priority from Japanese Patent Application No. 2011-163450, filed on Jul. 26, 2011; the entire contents of which are incorporated herein by reference.

FIELD

Embodiments described herein relate generally to level shift circuits.

BACKGROUND

In some semiconductor devices, in order to optimize the characteristics of an internal circuit, the level of an external power supply voltage is shifted and then supplied to the internal circuit. At that time, when there is a large difference between the delay time of the rising edge of an output voltage and the delay time of the falling edge of the output voltage, the deviation of the duty ratio of the output voltage increases, which results in a large reduction in operation margin.

BRIEF DESCRIPTION OF THE DRAWINGS

FIG. 16A is a block diagram illustrating the schematic structure of a semiconductor memory device according to a tenth embodiment to which the level shift circuit is applied;

FIG. 16B is a perspective view illustrating the schematic structure of a NAND memory 3-1 shown in FIG. 16A;

FIG. 16C is a perspective view illustrating the schematic structure of a semiconductor chip CP1 of the NAND memory 3-1 shown in FIG. 16B;

DETAILED DESCRIPTION

In general, according to an embodiment, a level shift circuit includes a plurality of level shift units which are connected to each other and in which the delay time of the rising edge of an output voltage is different from the delay time of the falling edge of the output voltage. The delay time of the rising edge of the output voltage from the previous level shift unit is compensated by the delay time of the falling edge of the output voltage from the next level shift unit, and the delay time of the falling edge of the output voltage from the previous level shift unit is compensated by the delay time of the rising edge of the output voltage from the next level shift unit.

Exemplary embodiments of the level shift circuit will be explained below in detail with reference to the accompanying drawings. The present invention is not limited to the following embodiments.

First Embodiment

Figure 1:
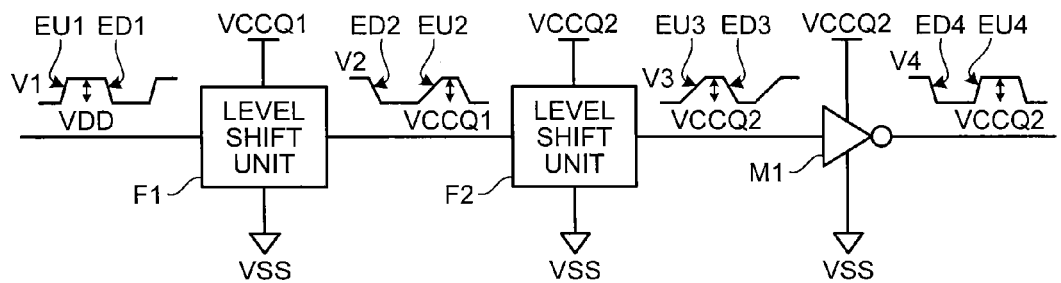
FIG. 1 is a block diagram illustrating the schematic structure of a level shift circuit according to a first embodiment.

FIG. 1 is a block diagram illustrating the schematic structure of a level shift circuit according to a first embodiment.

In FIG. 1, the level shift circuit includes level shift units F1 and F2, and the level shift unit F2 is connected to the rear stage of the level shift unit F1. An inverter M1 is connected to the rear stage of the level shift unit F2.

The level shift unit F1 can shift the level of an output voltage between a first power supply potential VSS and a second power supply potential VCCQ1. The level shift unit F2 can shift the level of the output voltage between the first power supply potential VSS and a third power supply potential VCCQ2. The inverter M1 can invert the output voltage between the first power supply potential VSS and the third power supply potential VCCQ2.

The first power supply potential VSS, the second power supply potential VCCQ1, and the third power supply potential VCCQ2 may satisfy the relationship VSS<VCCQ1≤VCCQ2 and the second power supply potential VCCQ1 may be equal to the third power supply potential VCCQ2. In addition, the first power supply potential VSS may be a ground potential.

In each of the level shift units F1 and F2, the delay time of the rising edge of the output voltage is different from the delay time of the falling edge of the output voltage.

The delay time of the rising edge of the output voltage means a delay time from the rise of the input voltage to the rise of the output voltage, and the delay time of the falling edge of the output voltage means a delay time from the fall of the input voltage to the fall of the output voltage.

The delay time of the rising edge of the output voltage is not limited to the time from a 100 percent rise in the level of the input voltage from the bottom to the top to a 100 percent rise in the level of the output voltage from the bottom to the top, but it may be arbitrarily defined. For example, the delay time of the rising edge of the output voltage may be the time from a 50 percent rise in the level of the input voltage from the bottom to a 50 percent rise in the level of the output voltage from the bottom.

The delay time of the falling edge of the output voltage is not limited to the time from a 100 percent fall in the level of the input voltage from the top to the bottom to a 100 percent fall in the level of the output voltage from the top, but it may be arbitrarily defined. For example, the delay time of the falling edge of the output voltage may be the time from a 50 percent fall in the level of the input voltage from the top to a 50 percent fall in the level of the output voltage from the top.

The level shift circuit can compensate the delay time of the rising edge of the output voltage from the previous level shift unit F1 with the delay time of the falling edge of the output voltage from the next level shift unit F2 and compensate the delay time of the falling edge of the output voltage from the previous level shift unit F1 with the delay time of the rising edge of the output voltage from the next level shift unit F2.

When an input voltage V1 with an amplitude VDD is input to the level shift unit F1, the level of the input voltage V1 shifts to an output voltage V2 with an amplitude VCCQ1 and the output voltage V2 is then input to the level shift unit F2. The voltage VDD may be less than the voltage VCCQ1.

In the level shift unit F2, the level of the output voltage V2 with the amplitude VCCQ1 shifts to an output voltage V3 with an amplitude VCCQ2 and the output voltage V3 is input to the inverter M1. Then, the inverter M1 inverts the output voltage V3 from the level shift unit F2 and an output voltage V4 is output from the inverter M1.

It is assumed that, in the level shift unit F1, the delay time of the falling edge ED2 of the output voltage V2 is more than that of the rising edge EU2 and, in the level shift unit F2, the delay time of the falling edge ED3 of the output voltage V3 is more than that of the rising edge EU3.

At that time, it is assumed that, in the level shift unit F1, the falling edge ED2 of the output voltage V2 is generated according to the rising edge EU1 of the input voltage V1 and the rising edge EU2 of the output voltage V2 is generated according to the falling edge ED1 of the input voltage V1. In this case, the amount of delay of the falling edge ED2 relative to the rising edge EU1 is less than the amount of delay of the rising edge EU2 relative to the falling edge ED1.

It is assumed that, in the level shift unit F2, the rising edge EU3 of the output voltage V3 is generated according to the falling edge ED2 of the input voltage V2, and the falling edge ED3 of the output voltage V3 is generated according to the rising edge EU2 of the input voltage V2. In this way, the amount of delay of the falling edge ED3 relative to the rising edge EU2 is less than that of the rising edge EU3 relative to the falling edge ED2.

As a result, the amount of delay of the rising edge EU2 relative to the falling edge ED1 which is more than that of the falling edge ED2 relative to the rising edge EU1 can be compensated by the amount of delay of the rising edge EU3 relative to the falling edge ED2 which is less than that of the falling edge ED3 relative to the rising edge EU2.

Therefore, assuming that the falling edge ED4 of the output voltage V4 is generated according to the rising edge EU3 of the output voltage V3 and the rising edge EU4 of the output voltage V4 is generated according to the falling edge ED3 of the output voltage V3, the inverter M1 can make the amount of delay of the falling edge ED4 relative to the rising edge EU1 close to the amount of delay of the rising edge EU4 relative to the falling edge ED1.

In the above-described embodiment, two level shift units are connected to each other. However, the even-numbered level shift units may be connected to each other.

Second Embodiment

Figure 2:
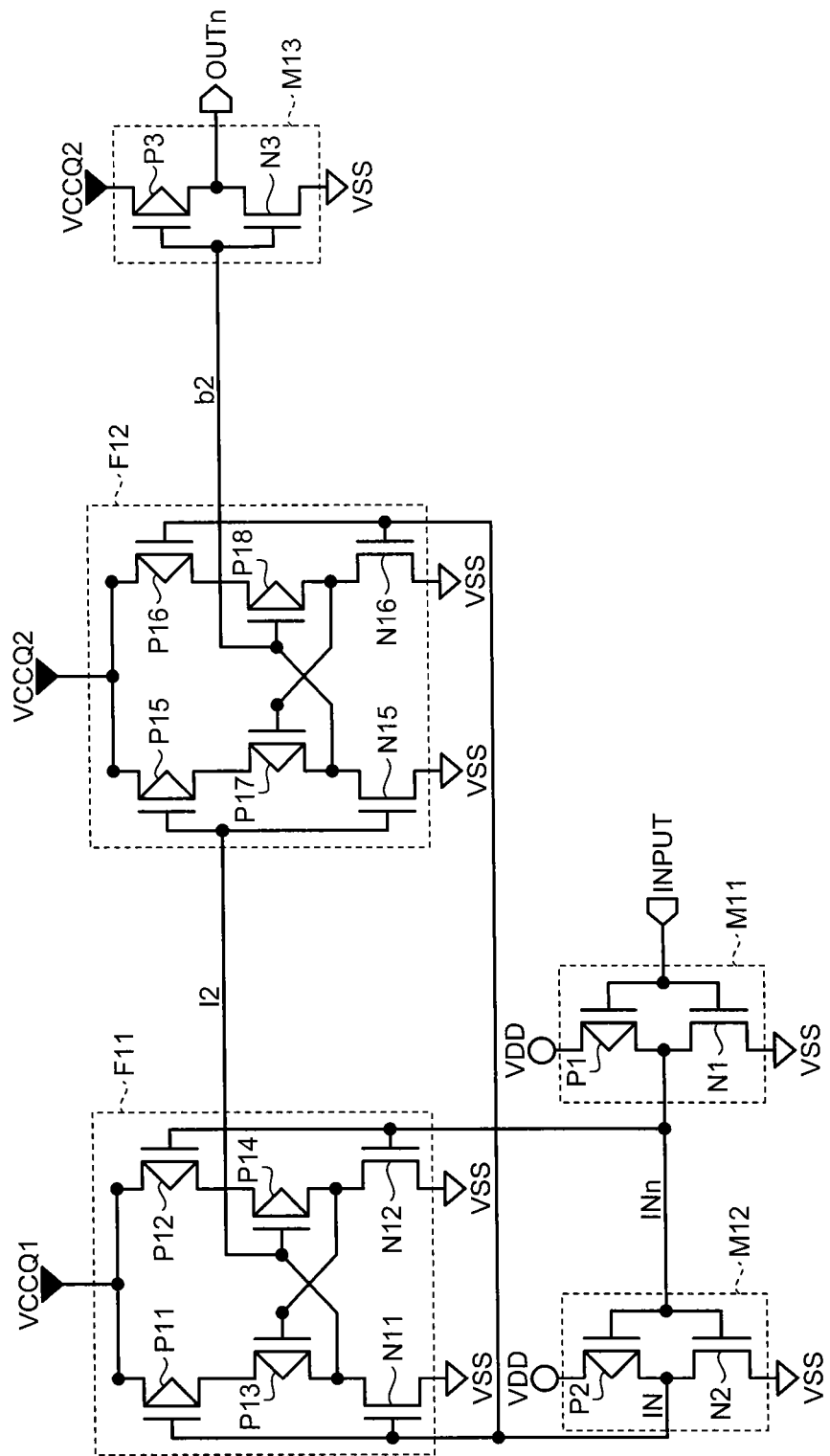
FIG. 2 is a circuit diagram illustrating the schematic structure of a level shift circuit according to a second embodiment.

FIG. 2 is a circuit diagram illustrating the schematic structure of a level shift circuit according to a second embodiment.

In FIG. 2, the level shift circuit includes level shift units F11 and F12, and the level shift unit F12 is connected to the rear stage of the level shift unit F11. An inverter M12 is connected to the front stage of the level shift units F11 and F12, an inverter M11 is connected to the front stage of the inverter M12, and an inverter M13 is connected to the rear stage of the level shift unit F12.

The level shift unit F11 can shift the level of an output voltage between a first power supply potential VSS and a second power supply potential VCCQ1. The level shift unit F12 can shift the level of an output voltage between the first power supply potential VSS and a third power supply potential VCCQ2. The inverters M11 and M12 can invert the output voltage between the first power supply potential VSS and a fourth power supply potential VDD. The inverter M13 can invert the output voltage between the first power supply potential VSS and the third power supply potential VCCQ2.

In each of the level shift units F11 and F12, the delay time of the rising edge of the output voltage is different from the delay time of the falling edge of the output voltage. The level shift unit F11 can perform a level shift operation on the basis of input voltages IN and INn. The input voltage IN is an inverted voltage of the input voltage INn. The input voltages IN and INn can be used as differential input voltages. The level shift unit F12 can perform a level shift operation using the input voltage IN to the level shift unit F11 and the output voltage I2 from the level shift unit F11 as differential input voltages.

The inverter M11 includes a P-channel field effect transistor P1 and an N-channel field effect transistor N1. The inverter M12 includes a P-channel field effect transistor P2 and an N-channel field effect transistor N2. The inverter M13 includes a P-channel field effect transistor P3 and an N-channel field effect transistor N3.

The level shift unit F11 includes P-channel field effect transistors P11 to P14 and N-channel field effect transistors N11 and N12. The level shift unit F12 includes P-channel field effect transistors P15 to P18 and N-channel field effect transistors N15 and N16.

The source of the P-channel field effect transistor P1 is connected to the fourth power supply potential VDD. The drain of the P-channel field effect transistor P1 is connected to the drain of the N-channel field effect transistor N1. The source of the N-channel field effect transistor N1 is connected to the first power supply potential VSS. The gate of the P-channel field effect transistor P1 is connected to the gate of the N-channel field effect transistor N1.

The source of the P-channel field effect transistor P2 is connected to the fourth power supply potential VDD. The drain of the P-channel field effect transistor P2 is connected to the drain of the N-channel field effect transistor N2. The source of the N-channel field effect transistor N2 is connected to the first power supply potential VSS. The gate of the P-channel field effect transistor P2 and the gate of the N-channel field effect transistor N2 are connected to the drain of the P-channel field effect transistor P1.

The sources of the P-channel field effect transistors P11 and P12 are connected to the second power supply potential VCCQ1. The drain of the P-channel field effect transistor P11 is connected to the source of the P-channel field effect transistor P13. The drain of the P-channel field effect transistor P13 is connected to the drain of the N-channel field effect transistor N11. The drain of the P-channel field effect transistor P12 is connected to the source of the P-channel field effect transistor P14. The drain of the P-channel field effect transistor P14 is connected to the drain of the N-channel field effect transistor N12. The sources of the N-channel field effect transistors N11 and N12 are connected to the first power supply potential VSS.

The gate of the P-channel field effect transistor P11 and the gate of the N-channel field effect transistor N11 are connected to the drain of the P-channel field effect transistor P2. The gate of the P-channel field effect transistor P12 and the gate of the N-channel field effect transistor N12 are connected to the drain of the P-channel field effect transistor P1. The gate of the P-channel field effect transistor P13 is connected to the drain of the P-channel field effect transistor P14. The gate of the P-channel field effect transistor P14 is connected to the drain of the P-channel field effect transistor P13.

The sources of the P-channel field effect transistors P15 and P16 are connected to the third power supply potential VCCQ2. The drain of the P-channel field effect transistor P15 is connected to the source of the P-channel field effect transistor P17. The drain of the P-channel field effect transistor P17 is connected to the drain of the N-channel field effect transistor N15. The drain of the P-channel field effect transistor P16 is connected to the source of the P-channel field effect transistor P18. The drain of the P-channel field effect transistor P18 is connected to the drain of the N-channel field effect transistor N16. The sources of the N-channel field effect transistors N15 and N16 are connected to the first power supply potential VSS.

The gate of the P-channel field effect transistor P15 and the gate of the N-channel field effect transistor N15 are connected to the drain of the P-channel field effect transistor P13. The gate of the P-channel field effect transistor P16 and the gate of the N-channel field effect transistor N16 are connected to the drain of the P-channel field effect transistor P2. The gate of the P-channel field effect transistor P17 is connected to the drain of the P-channel field effect transistor P18. The gate of the P-channel field effect transistor P18 is connected to the drain of the P-channel field effect transistor P17.

The source of the P-channel field effect transistor P3 is connected to the third power supply potential VCCQ2. The drain of the P-channel field effect transistor P3 is connected to the drain of the N-channel field effect transistor N3. The source of the N-channel field effect transistor N3 is connected to the first power supply potential VSS. The gate of the P-channel field effect transistor P3 and the gate of the N-channel field effect transistor N3 are connected to the drain of the P-channel field effect transistor P17.

Figure 3:
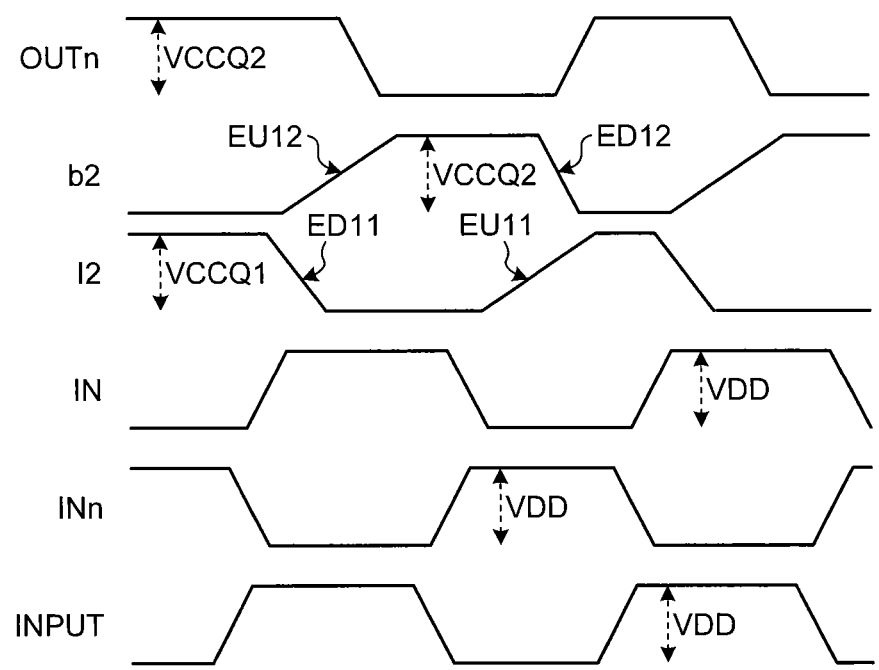
FIG. 3 is a timing chart illustrating the voltage waveform of each unit in the level shift circuit shown in FIG. 2.

FIG. 3 is a timing chart illustrating the voltage waveform of each unit in the level shift circuit shown in FIG. 2.

In FIG. 3, when an input voltage INPUT is input to the inverter M11, the inverter M11 inverts the input voltage INPUT to generate the input voltage INn and outputs the input voltage INn to the inverter M12 and the level shift unit F11.

Then, when the input voltage INn is input to the inverter M12, the inverter M12 inverts the input voltage INn to generate the input voltage IN and outputs the input voltage IN to the level shift unit F11. The amplitudes of the input voltages INPUT, INn, and IN are maintained at VDD.

Then, the level shift unit F11 performs a level shift operation using the input voltages INn and IN as the differential input voltages to generate an output voltage I2 with an amplitude VCCQ1. The output voltage I2 is input to the level shift unit F12.

Then, the level shift unit F12 performs a level shift operation using the input voltage IN to the level shift unit F11 and the output voltage I2 from the level shift unit F11 as the differential input voltages to generate an output voltage b2 with an amplitude VCCQ2. The output voltage b2 is input to the inverter M13.

Then, the inverter M13 inverts the output voltage b2 from the level shift unit F12 and outputs an output voltage OUTn.

In the level shift unit F11, when the input voltage INn is at an "L" level and the input voltage IN is at an "H" level, the P-channel field effect transistors P12 and P14 and the N-channel field effect transistor N11 are turned on and the P-channel field effect transistors P11 and P13 and the N-channel field effect transistor N12 are turned off. Therefore, the output voltage I2 from the level shift unit F11 is reduced to the first power supply potential VSS through the N-channel field effect transistor N11 and changes to an "L" level.

In the level shift unit F11, when the input voltage INn is at an "H" level and the input voltage IN is at an "L" level, the P-channel field effect transistors P12 and P14 and the N-channel field effect transistor N11 are turned off and the P-channel field effect transistors P11 and P13 and the N-channel field effect transistor N12 are turned on. Therefore, the output voltage I2 from the level shift unit F11 is raised to the second power supply potential VCCQ1 through the P-channel field effect transistors P11 and P13 and changes to an "H" level. The delay time of the rising edge EU11 of the output voltage I2 is more than the delay time of the falling edge ED11.

In the level shift unit F12, when the input voltage IN is at the "L" level and the output voltage I2 is at the "H" level, the P-channel field effect transistors P16 and P18 and the N-channel field effect transistor N15 are turned on and the P-channel field effect transistors P15 and P17 and the N-channel field effect transistor N16 are turned off. Therefore, the output voltage b2 from the level shift unit F12 is reduced to the first power supply potential VSS through the N-channel field effect transistor N15 and changes to an "L" level.

In the level shift unit F12, when the input voltage IN is at the "H" level and the output voltage I2 is at the "L" level, the P-channel field effect transistors P16 and P18 and the N-channel field effect transistor N15 are turned off and the P-channel field effect transistors P15 and P17 and the N-channel field effect transistor N16 are turned on. Therefore, the output voltage b2 from the level shift unit F12 is raised to the third power supply potential VCCQ2 through the P-channel field effect transistors P15 and P17 and changes to an "H". The delay time of the rising edge EU12 of the output voltage b2 is more than the delay time of the falling edge ED12.

Therefore, the delay time of the falling edge ED11 of the output voltage I2 from the previous level shift unit F11 can be compensated by the delay time of the rising edge EU12 of the output voltage b2 from the next level shift unit F12, and the delay time of the rising edge EU11 of the output voltage I2 from the previous level shift unit F11 can be compensated by the delay time of the falling edge ED12 of the output voltage b2 from the next level shift unit F12. As a result, it is possible to reduce the deviation of the duty ratio of the output voltage OUTn to the input voltage INPUT, as compared to the deviation of the duty ratio of the output voltage I2 to the input voltage INPUT. Therefore, it is possible to prevent a reduction in operation margin.

Figure 4:
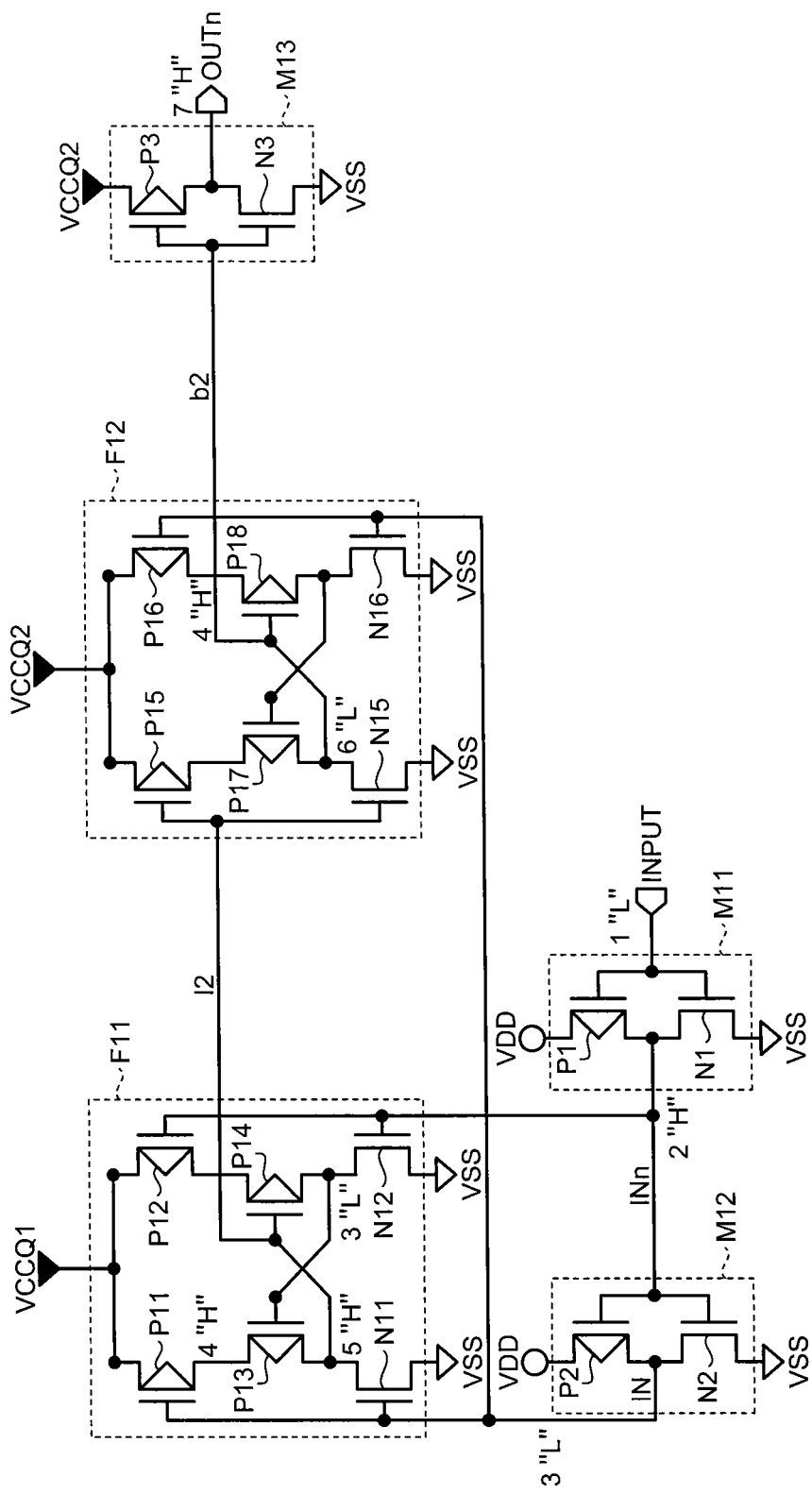
FIG. 4 is a circuit diagram illustrating the delay of each node when an input voltage INPUT to an inverter M11 falls in the level shift circuit shown in FIG. 2.

FIG. 4 is a circuit diagram illustrating the delay of each node when the input voltage INPUT to the inverter M11 falls in the level shift circuit shown in FIG. 2. In the example shown in FIG. 4, the delay time corresponding to one transistor is 1 and the delay time of each node is shown together with the level.

In FIG. 4, when the input voltage INPUT is at an "L" level and the delay time is 1, the input voltage INn is delayed by a value corresponding to one transistor of the inverter M11 and rises. Therefore, the input voltage INn is at an "H" level and the delay time is 2. When the input voltage INn is at the "H" level, the drain potential of the P-channel field effect transistor P14 is delayed by a value corresponding to one transistor of the level shift unit F11 and falls. Therefore, the drain potential of the P-channel field effect transistor P14 is at an "L" level and the delay time is 3. The P-channel field effect transistor P13 is turned on.

When the input voltage INn is at the "H" level, the input voltage IN is delayed by a value corresponding to one transistor of the inverter M12 and falls. Therefore, the input voltage IN is at an "L" level and the delay time is 3. When the input voltage IN is at the "L" level, the drain potential of the P-channel field effect transistor P11 is delayed by a value corresponding one transistor of the level shift unit F11 and rises. Therefore, the drain potential of the P-channel field effect transistor P11 is at an "H" level and the delay time is 4. When the P-channel field effect transistor P13 is turned on and the drain potential of the P-channel field effect transistor P11 is at the "H" level, the output voltage I2 is delayed by a value corresponding to one transistor of the level shift unit F11 and rises. Therefore, the output voltage I2 is at an "H" level and the delay time is 5.

When the output voltage I2 is at the "H" level, the output voltage b2 is delayed by a value corresponding to one transistor of the level shift unit F12 and falls. Therefore, the output voltage b2 is at an "L" level and the delay time is 6. When the output voltage b2 is at the "L" level, the output voltage OUTn is delayed by a value corresponding to one transistor of the inverter M13 and rises. Therefore, the output voltage OUTn is at an "H" level and the delay time is 7.

Figure 5:
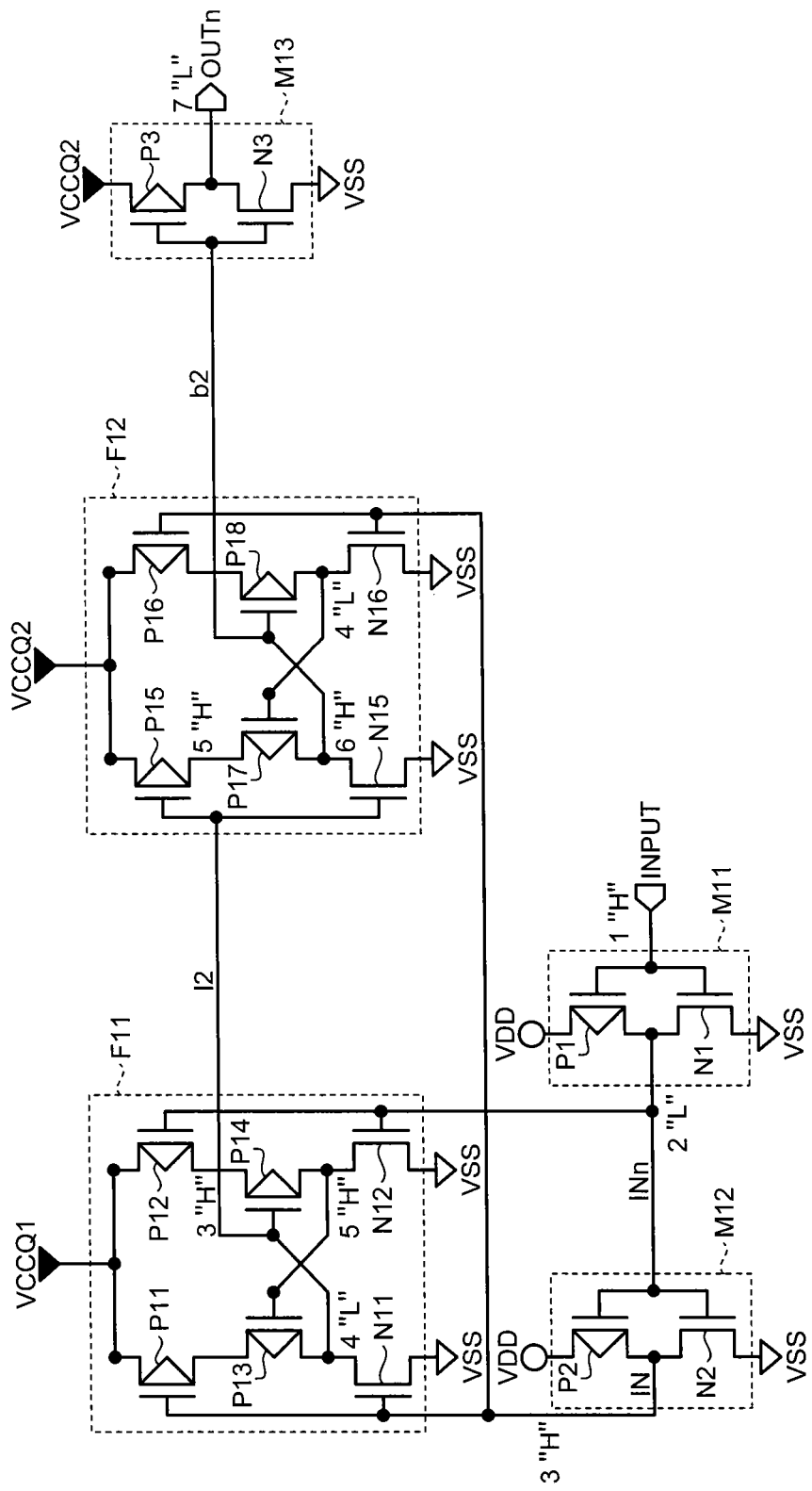
FIG. 5 is a circuit diagram illustrating the delay of each node when the input voltage INPUT to the inverter M11 rises in the level shift circuit shown in FIG. 2.

FIG. 5 is a circuit diagram illustrating the delay of each node when the input voltage INPUT of the inverter M11 rises in the level shift circuit shown in FIG. 2. In the example shown in FIG. 5, the delay time corresponding to one transistor is 1 and the delay time of each node is shown together with the level.

In FIG. 5, when the input voltage INPUT is at an "H" level and the delay time is 1, the input voltage INn is delayed by a value corresponding to one transistor of the inverter M11 and falls. Therefore, the input voltage INn is at an "L" and the delay time is 2. When the input voltage INn is at the "L" level, the drain potential of the P-channel field effect transistor P12 is delayed by a value corresponding to one transistor of the level shift unit F11 and rises. Therefore, the drain potential of the P-channel field effect transistor P12 is at an "H" level and the delay time is 3.

When the input voltage INn is at the "L" level, the input voltage IN is delayed by a value corresponding to one transistor of the inverter M12 and rises. Therefore, the input voltage IN is at an "H" level and the delay time is 3. When the input voltage IN is at the "H" level, the output voltage I2 is delayed by a value corresponding to one transistor of the level shift unit F11 and falls. Therefore, the output voltage I2 is at an "L" level and the delay time is 4. When the drain potential of the P-channel field effect transistor P12 is at an "H" level and the output voltage I2 is at an "L" level, the drain potential of the P-channel field effect transistor P14 is delayed by a value corresponding to one transistor of the level shift unit F11 and rises. Therefore, the drain potential of the P-channel field effect transistor P14 is at the "H" level and the delay time is 5.

When the input voltage IN is at the "H" level, the drain potential of the P-channel field effect transistor P18 is delayed by a value corresponding to one transistor of the level shift unit F12 and falls. Therefore, the drain potential of the P-channel field effect transistor P18 is at an "L" level and the delay time is 4. The P-channel field effect transistor P17 is turned on.

When the output voltage I2 is at the "L" level, the drain potential of the P-channel field effect transistor P15 is delayed by a value corresponding to one transistor of the level shift unit F12 and rises. Therefore, the drain potential of the P-channel field effect transistor P15 is at an "H" level and the delay time is 5. When the P-channel field effect transistor P17 is turned on and the drain potential of the P-channel field effect transistor P15 is at the "H", the output voltage b2 is delayed by a value corresponding to one transistor of the level shift unit F12 and rises. Therefore, the output voltage b2 is at an "H" level and the delay time is 6. When the output voltage b2 is at the "H" level, the output voltage OUTn is delayed by a value corresponding to one transistor of the inverter M13 and falls. Therefore, the output voltage OUTn is at an "L" level and the delay time is 7.

When the input voltage IN is input to the gate of the N-channel field effect transistor N16, the gate voltage of the P-channel field effect transistor P17 can fall before the source potential of the P-channel field effect transistor P17 rises. Therefore, before the source potential of the P-channel field effect transistor P17 rises, the P-channel field effect transistor P17 can be turned on. The number of stages of the delay of the transistor for the time from the rise of the input voltage INPUT to the rise of the output voltage b2 can be equal to the number of stages of the delay of the transistor for the time from the fall of the input voltage INPUT to the fall of the output voltage b2.

Third Embodiment

Figure 6:
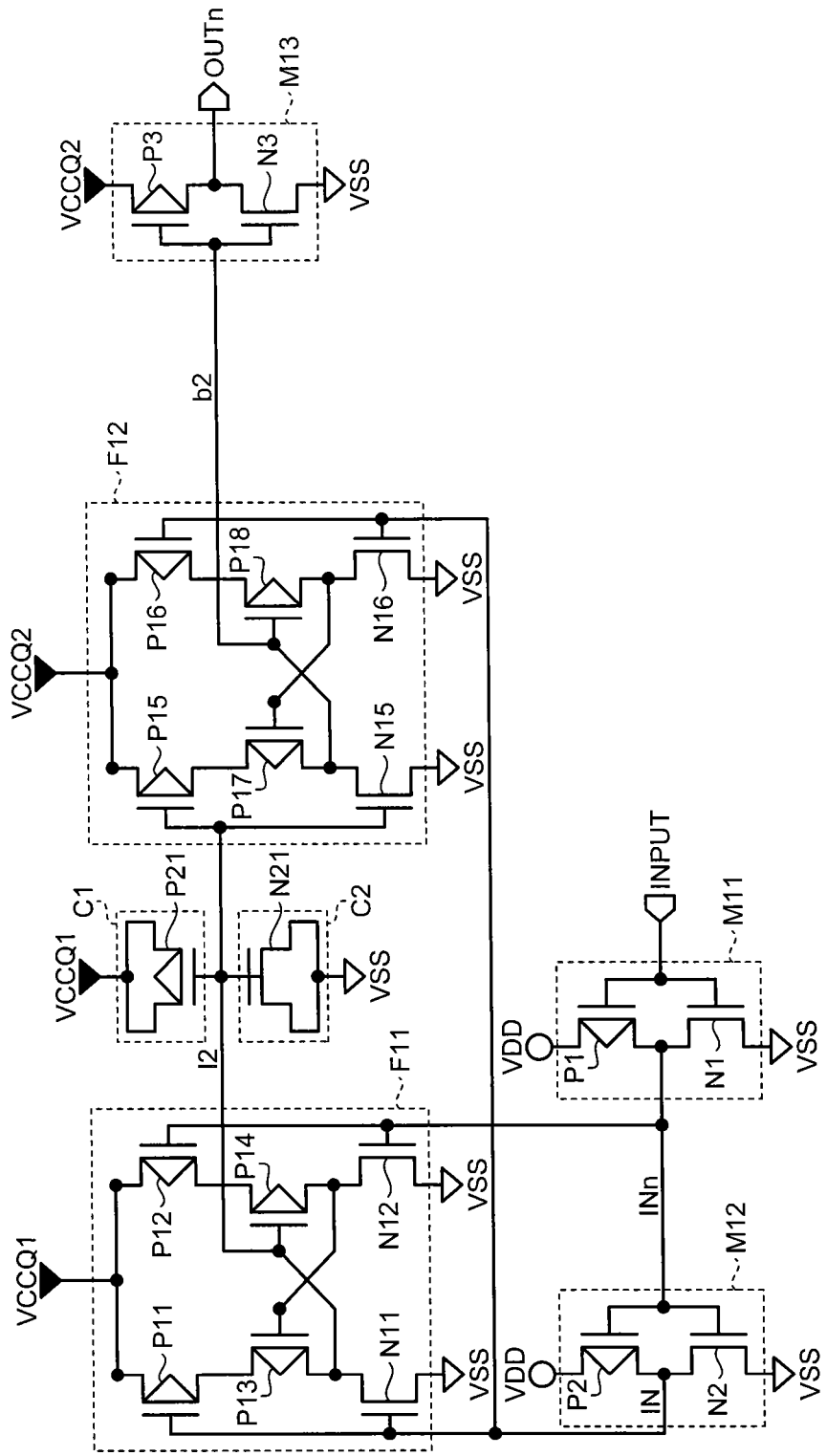
FIG. 6 is a circuit diagram illustrating the schematic structure of a level shift circuit according to a third embodiment.

FIG. 6 is a circuit diagram illustrating the schematic structure of a level shift circuit according to a third embodiment.

In FIG. 6, the level shift circuit further includes capacitive elements C1 and C2, as compared to the level shift circuit shown in FIG. 2. The capacitive elements C1 and C2 are connected to the output side of a level shift unit F1. The capacitive element C1 includes a P-channel field effect transistor P21 and the capacitive element C2 includes an N-channel field effect transistor N21.

The source and drain of the P-channel field effect transistor P21 are connected to a second power supply potential VCCQ1. The gate of the P-channel field effect transistor P21 is connected to the drain of a P-channel field effect transistor P13. The source and drain of the N-channel field effect transistor N21 are connected to a first power supply potential VSS. The gate of the N-channel field effect transistor N21 is connected to the drain of the P-channel field effect transistor P13.

The capacitive elements C1 and C2 can form capacitance using the channels of the P-channel field effect transistor P21 and the N-channel field effect transistor N21. At that time, in the capacitive element C1, at the beginning of the rise of an output voltage I2, a channel is formed in the P-channel field effect transistor P21 and the P-channel field effect transistor P21 can function as capacitance. In the capacitive element C2, at the end of the rise of the output voltage I2, a channel is formed in the N-channel field effect transistor N21 and the N-channel field effect transistor N21 can function as capacitance.

In the embodiment illustrated in FIG. 6, the source and drain of the P-channel field effect transistor P21 are connected to the second power supply potential VCCQ1 and the source and drain of the N-channel field effect transistor N21 are connected to the first power supply potential VSS. However, the potential of the source and drain of the P-channel field effect transistor P21 may be controlled by the output of the CMOS circuit and the potential of the source and drain of the N-channel field effect transistor N21 may be controlled by an output with a polarity opposite to that of the output of the CMOS circuit. The input of the CMOS circuit can be set by a register value or ROM fuse data. In addition, a plurality of P-channel field effect transistors P21 and a plurality of N-channel field effect transistors N21 may be provided. The potentials of the sources and drains of the P-channel field effect transistors P21 and the potentials of the sources and drains of the N-channel field effect transistors N21 may be individually controlled. In this way, it is possible to switch the levels of the potentials of the sources and drains of the P-channel field effect transistors P21 and the levels of the potentials of the sources and drains of the N-channel field effect transistors N21. For example, it is possible to adjust capacitance for each IO without changing a mask.

Figure 7:
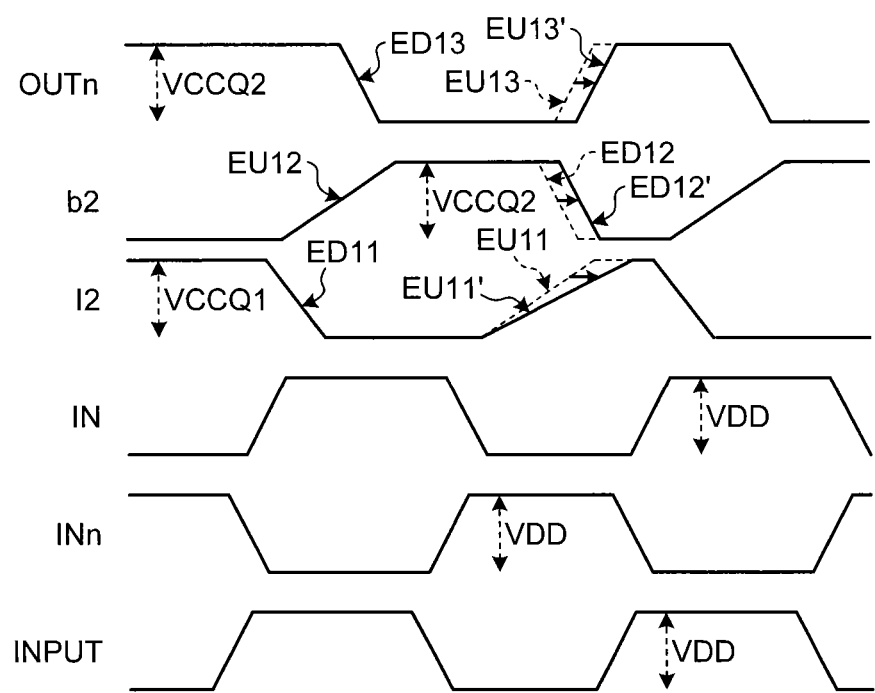
FIG. 7 is a timing chart illustrating the voltage waveform of each unit in the level shift circuit shown in FIG. 6.

FIG. 7 is a timing chart illustrating the voltage waveform of each unit in the level shift circuit shown in FIG. 6.

In FIG. 7, the amount of delay of the rising edge EU11 of the output voltage I2 is more than that of the falling edge ED11 of the output voltage I2 due to the capacitive elements C1 and C2. Therefore, when the capacitive elements C1 and C2 are connected to the output side of the level shift unit F11, the rising edge of the output voltage I2 is changed from EU11 to EU11'.

When the rising edge of the output voltage I2 is changed from EU11 to EU11', the falling edge of the output voltage b2 is changed from ED12 to ED12' and the rising edge of the output voltage OUTn is changed from EU13 to EU13'. On the other hand, the amount of delay of the falling edge ED11 of the output voltage I2 due to the capacitive elements C1 and C2 is small. Therefore, there is little change in the timing of the rising edge EU12 of the output voltage b2 and there is little change in the timing of the falling edge ED13 of the output voltage OUTn.

Therefore, when the capacitive elements C1 and C2 are connected to the output side of the level shift unit F11, it is possible to change the duty ratio of the output voltage OUTn and reduce the deviation of the duty ratio due to the level shift circuit.

In the above-described embodiment, a method in which the capacitive elements C1 and C2 are connected to the output side of the level shift unit F11 has been described. However, only one of the capacitive elements C1 and C2 may be connected.

In the above-described embodiment, a method in which the source and drain of the P-channel field effect transistor P21 are fixed to the second power supply potential VCCQ1 has been described. However, the source and drain of the P-channel field effect transistor P21 may be switched between the first power supply potential VSS and the second power supply potential VCCQ1. At that time, when the source and drain of the P-channel field effect transistor P21 are switched to the first power supply potential VSS, no channel is formed in the P-channel field effect transistor P21 and the P-channel field effect transistor P21 does not function as capacitance. Therefore, it is possible to change the capacitance of the output side of the level shift unit F11 and adjust the amount of delay due to the capacitive element C1.

In the above-described embodiment, a method in which the source and drain of the N-channel field effect transistor N21 are fixed to the first power supply potential VSS has been described above. However, the source and drain of the N-channel field effect transistor N21 may be switched between the first power supply potential VSS and the second power supply potential VCCQ1. At that time, when the source and drain of the N-channel field effect transistor N21 are switched to the second power supply potential VCCQ1, no channel is formed in the N-channel field effect transistor N21 and the N-channel field effect transistor N21 does not function as capacitance. Therefore, it is possible to change the capacitance of the output side of the level shift unit F11 and adjust the amount of delay due to the capacitive element C2.

In order to accurately change the capacitance of the output side of the level shift unit F11, a plurality of sets of the capacitive elements C1 and C2 may be connected in parallel to each other and power supply to the capacitive elements C1 and C2 may be switched.

In the above-described embodiment, a method in which the P-channel field effect transistor P21 and the N-channel field effect transistor N21 are used as the capacitive elements C1 and C2 has been described. However, a capacitor in which a dielectric body is interposed between metal electrodes may be used.

Fourth Embodiment

Figure 8:
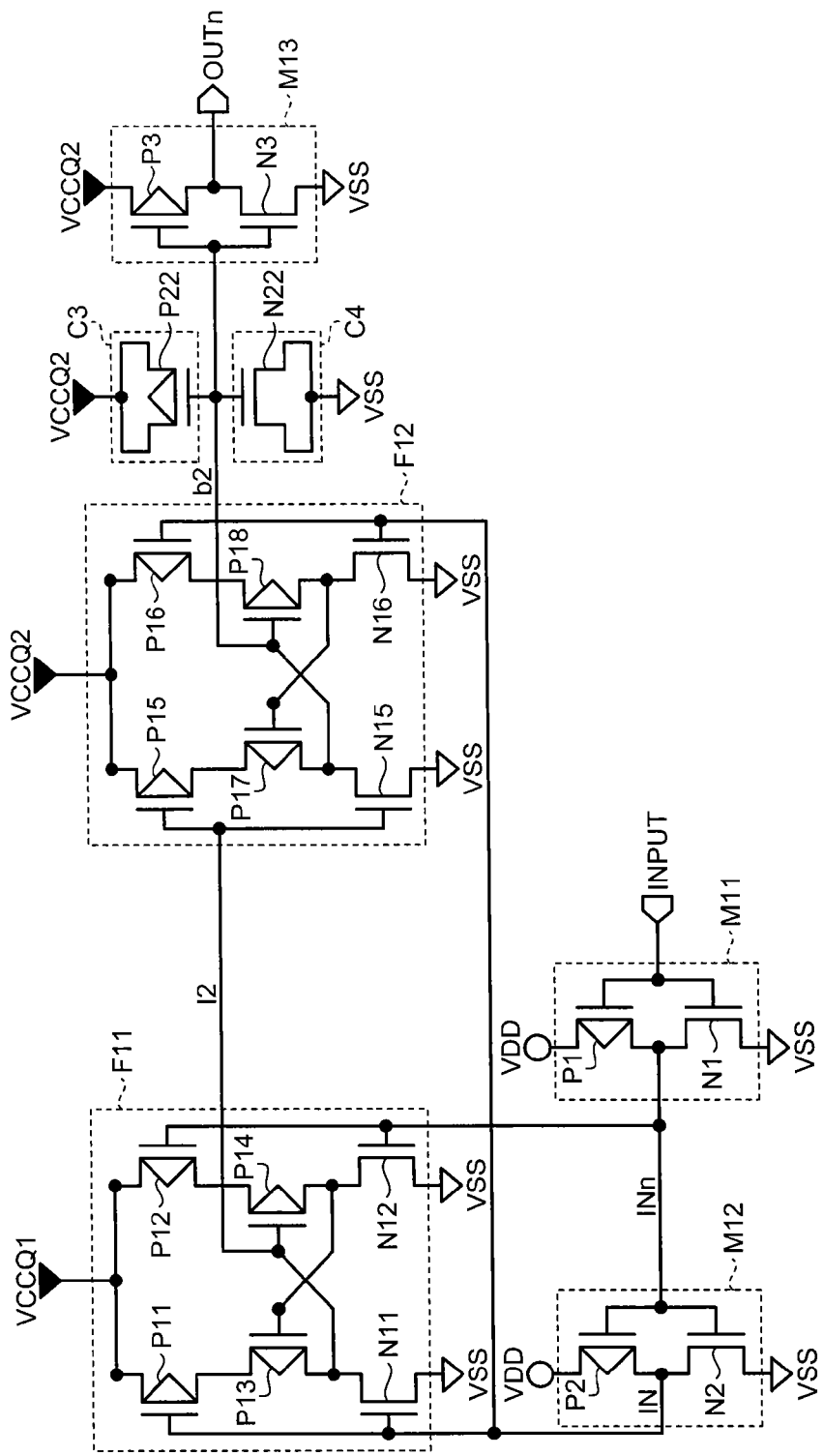
FIG. 8 is a circuit diagram illustrating the schematic structure of a level shift circuit according to a fourth embodiment.

FIG. 8 is a circuit diagram illustrating the schematic structure of a level shift circuit according to a fourth embodiment.

In FIG. 8, the level shift circuit further includes capacitive elements C3 and C4, as compared to the level shift circuit shown in FIG. 2. The capacitive elements C3 and C4 are connected to the output side of a level shift unit F12. The capacitive element C3 includes a P-channel field effect transistor P22 and the capacitive element C4 includes an N-channel field effect transistor N22.

The source and drain of the P-channel field effect transistor P22 are connected to a third power supply potential VCCQ2. The gate of the P-channel field effect transistor P22 is connected to the drain of a P-channel field effect transistor P17. The source and drain of the N-channel field effect transistor N22 are connected to a first power supply potential VSS. The gate of the N-channel field effect transistor N22 is connected to the drain of the P-channel field effect transistor P17.

The capacitive elements C3 and C4 can form capacitance using the channels of the P-channel field effect transistor P22 and the N-channel field effect transistor N22. At that time, in the capacitive element C3, at the beginning of the rise of the output voltage b2, a channel is formed in the P-channel field effect transistor P22 and the P-channel field effect transistor P22 can function as capacitance. In the capacitive element C4, at the end of the rise of the output voltage b2, a channel is formed in the N-channel field effect transistor N22 and the N-channel field effect transistor N22 can function as capacitance.

In the embodiment illustrated in FIG. 8, the source and drain of the P-channel field effect transistor P22 are connected to the third power supply potential VCCQ2 and the source and drain of the N-channel field effect transistor N22 are connected to the first power supply potential VSS. However, the potential of the source and drain of the P-channel field effect transistor P22 may be controlled by the output of the CMOS circuit and the potential of the source and drain of the N-channel field effect transistor N22 may be controlled by an output with a polarity opposite to that of the output of the CMOS circuit. The input of the CMOS circuit can be set by a register value or ROM fuse data. In addition, a plurality of P-channel field effect transistors P22 and a plurality of N-channel field effect transistors N22 may be provided. The potentials of the sources and drains of the P-channel field effect transistors P22 and the potentials of the sources and drains of the N-channel field effect transistors N22 may be individually controlled. In this way, it is possible to switch the levels of the potentials of the sources and drains of the P-channel field effect transistors P22 and the levels of the potentials of the sources and drains of the N-channel field effect transistors N22. For example, it is possible to adjust capacitance for each IO without changing a mask.

Figure 9:
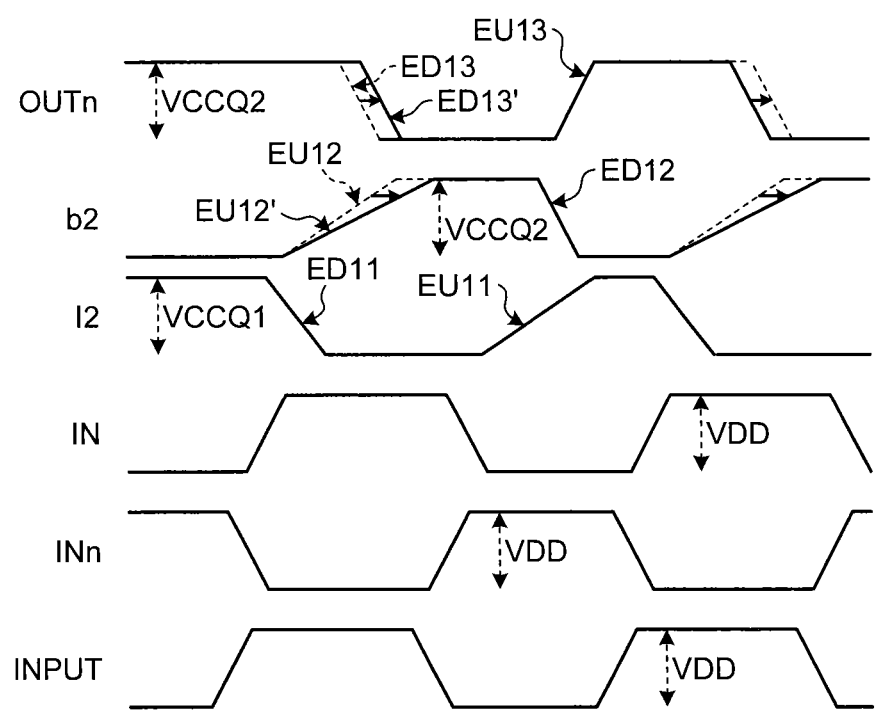
FIG. 9 is a timing chart illustrating the voltage waveform of each unit in the level shift circuit shown in FIG. 8.

FIG. 9 is a timing chart illustrating the voltage waveform of each unit in the level shift circuit shown in FIG. 8.

In FIG. 9, the amount of delay of the rising edge EU12 of an output voltage b2 is more than that of the falling edge ED12 of the output voltage b2 due to the capacitive elements C3 and C4. Therefore, when the capacitive elements C3 and C4 are connected to the output side of the level shift unit F12, the falling edge of the output voltage b2 is changed from ED12 to ED12'.

When the rising edge of the output voltage b2 is changed from EU12 to EU12', the falling edge of an output voltage OUTn is changed from ED13 to ED13'. On the other hand, the amount of delay of the falling edge ED12 of the output voltage b2 due to the capacitive elements C3 and C4 is small. Therefore, there is little change in the timing of the falling edge ED12 of the output voltage b2 and there is little change in the rising edge EU13 of the output voltage OUTn.

Therefore, when the capacitive elements C3 and C4 are connected to the output side of the level shift unit F12, it is possible to change the duty ratio of the output voltage OUTn and reduce the deviation of the duty ratio due to the level shift circuit.

In the above-described embodiment, a method in which the capacitive elements C3 and C4 are connected to the output side of the level shift unit F12 has been described. However, only one of the capacitive elements C3 and C4 may be connected.

In the above-described embodiment, a method in which the source and drain of the P-channel field effect transistor P22 are fixed to the third power supply potential VCCQ2 has been described. However, the source and drain of the P-channel field effect transistor P22 may be switched between the first power supply potential VSS and the third power supply potential VCCQ2. At that time, when the source and drain of the P-channel field effect transistor P22 are switched to the first power supply potential VSS, no channel is formed in the P-channel field effect transistor P22 and the P-channel field effect transistor P22 does not function as capacitance. Therefore, it is possible to change the capacitance of the output side of the level shift unit F12 and adjust the amount of delay due to the capacitive element C3.

In the above-described embodiment, a method in which the source and drain of the N-channel field effect transistor N22 are fixed to the first power supply potential VSS has been described above. However, the source and drain of the N-channel field effect transistor N22 may be switched between the first power supply potential VSS and the third power supply potential VCCQ2. At that time, when the source and drain of the N-channel field effect transistor N22 are switched to the third power supply potential VCCQ2, no channel is formed in the N-channel field effect transistor N22 and the N-channel field effect transistor N22 does not function as capacitance. Therefore, it is possible to change the capacitance of the output side of the level shift unit F12 and adjust the amount of delay due to the capacitive element C4.

In order to accurately change the capacitance of the output side of the level shift unit F12, a plurality of sets of the capacitive elements C3 and C4 may be connected in parallel to each other and power supply to the capacitive elements C3 and C4 may be switched.

In the above-described embodiment, a method in which the P-channel field effect transistor P22 and the N-channel field effect transistor N22 are used as the capacitive elements C3 and C4 has been described. However, a capacitor in which a dielectric body is interposed between metal electrodes may be used.

Fifth Embodiment

Figure 10:
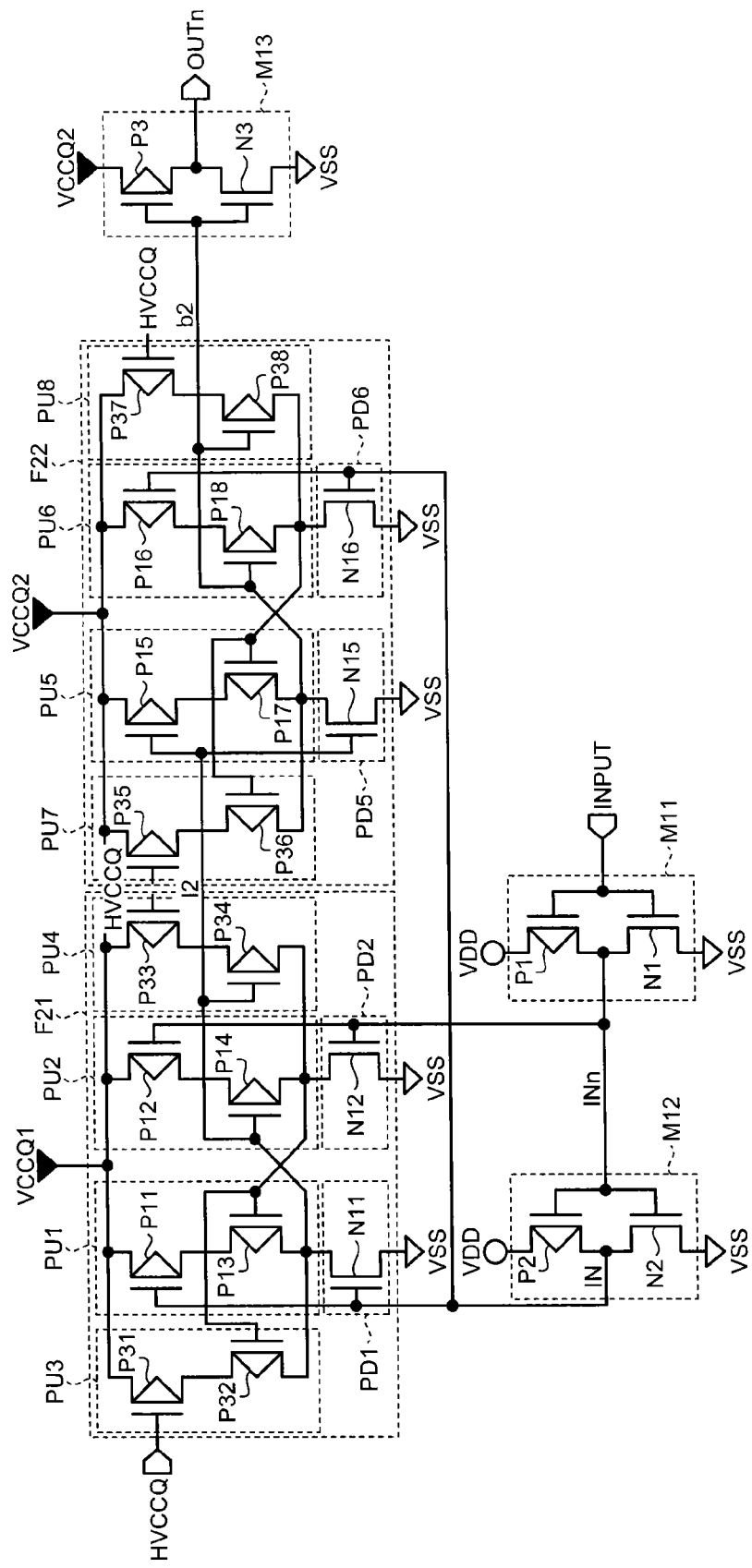
FIG. 10 is a circuit diagram illustrating the schematic structure of a level shift circuit according to a fifth embodiment.

FIG. 10 is a circuit diagram illustrating the schematic structure of a level shift circuit according to a fifth embodiment.

In FIG. 10, the level shift circuit includes level shift units F21 and F22. The level shift unit F22 is connected to the rear stage of the level shift unit F21. An inverter M12 is connected to the front stage of the level shift units F21 and F22. An inverter M11 is connected to the front stage of the inverter M12. An inverter M13 is connected to the rear stage of the level shift unit F22.

The level shift unit F21 further includes P-channel field effect transistors P31 to P34, as compared to the level shift unit F11 shown in FIG. 2. The level shift unit F22 further includes P-channel field effect transistors P35 to P38, as compared to the level shift unit F12 shown in FIG. 2.

The sources of the P-channel field effect transistors P31 and P33 are connected to a second power supply potential VCCQ1. The drain of the P-channel field effect transistor P31 is connected to the source of the P-channel field effect transistor P32. The drain of the P-channel field effect transistor P32 is connected to the drain of an N-channel field effect transistor N11. The drain of the P-channel field effect transistor P33 is connected to the source of the P-channel field effect transistor P34. The drain of the P-channel field effect transistor P34 is connected to the drain of an N-channel field effect transistor N12.

The gate of the P-channel field effect transistor P32 is connected to the gate of a P-channel field effect transistor P13. The gate of the P-channel field effect transistor P34 is connected to the gate of a P-channel field effect transistor P14.

The sources of the P-channel field effect transistors P35 and P37 are connected to a third power supply potential VCCQ2. The drain of the P-channel field effect transistor P35 is connected to the source of the P-channel field effect transistor P36. The drain of the P-channel field effect transistor P36 is connected to the drain of an N-channel field effect transistor N15. The drain of the P-channel field effect transistor P37 is connected to the source of the P-channel field effect transistor P38. The drain of the P-channel field effect transistor P38 is connected to the drain of an N-channel field effect transistor N16.

The gate of the P-channel field effect transistor P36 is connected to the gate of a P-channel field effect transistor P17. The gate of the P-channel field effect transistor P38 is connected to the gate of a P-channel field effect transistor P18.

The P-channel field effect transistors P11 and P13 form a pull-up element PU1. The P-channel field effect transistors P12 and P14 form a pull-up element PU2. The P-channel field effect transistors P31 and P32 form a pull-up element PU3.

The P-channel field effect transistors P33 and P34 form a pull-up element PU4. The N-channel field effect transistor N11 forms a pull-down element PD1 and the N-channel field effect transistor N12 forms a pull-down element PD2.

The pull-up element PU1 and the pull-down element PD1 are connected in series to each other and the pull-up element PU2 and the pull-down element PD2 are connected in series to each other. The pull-up elements PU1 and PU3 are connected in parallel to each other and the pull-up elements PU2 and PU4 are connected in parallel to each other. The pull-up elements PU1 to PU4 can pull up an output voltage I2 to the second power supply potential VCCQ1. The pull-down elements PD1 and PD2 can pull down the output voltage I2 to the first power supply potential VSS.

The P-channel field effect transistors P15 and P17 form a pull-up element PU5. The P-channel field effect transistors P16 and P18 form a pull-up element PU6. The P-channel field effect transistors P35 and P36 form a pull-up element PU7. The P-channel field effect transistors P37 and P38 form a pull-up element PU8. The N-channel field effect transistor N15 forms a pull-down element PD5 and the N-channel field effect transistor N16 forms a pull-down element PD6.

The pull-up element PU5 and the pull-down element PD5 are connected in series to each other and the pull-up element PU6 and the pull-down element PD6 are connected in series to each other. The pull-up elements PU5 and PU7 are connected in parallel to each other and the pull-up elements PU6 and PU8 are connected in parallel to each other. The pull-up elements PU5 to PU8 can pull up an output voltage b2 to the third power supply potential VCCQ2. The pull-down elements PD5 and PD6 can pull down the output voltage b2 to the first power supply potential VSS.

A switching signal HVCCQ is input to the gates of the P-channel field effect transistors P31, P33, P35, and P37. When the second power supply potential VCCQ1 and the third power supply potential VCCQ2 are low, the switching signal HVCCQ can have an "L" level. When the second power supply potential VCCQ1 and the third power supply potential VCCQ2 are high, the switching signal HVCCQ can have an "H" level.

When the switching signal HVCCQ is at the "L" level, the P-channel field effect transistors P31, P33, P35, and P37 are turned on. Then, the pull-up elements PU3, PU4, PU7, and PU8 are driven and the pull-up capability of the level shift units F21 and F22 is increased. On the other hand, when the switching signal HVCCQ is at the "H" level, the P-channel field effect transistors P31, P33, P35, and P37 are turned off. Then, the driving of the pull-up elements PU3, PU4, PU7, and PU8 is stopped and the pull-up capability of the level shift units F21 and F22 is reduced.

In this way, even when the second power supply potential VCCQ1 and the third power supply potential VCCQ2 are changed, it is possible to prevent a change in the delay time of the rising edges of the output voltages I2 and b2 and reduce the deviation of the duty ratio of the output voltage OUTn.

In order to reduce the deviation of the duty ratio of the output voltage OUTn, the capacitive elements C1 and C2 shown in FIG. 6 may be connected to the output side of the level shift unit F21 and the capacitive elements C3 and C4 shown in FIG. 8 may be connected to the output side of the level shift unit F22.

Sixth Embodiment

Figure 11:
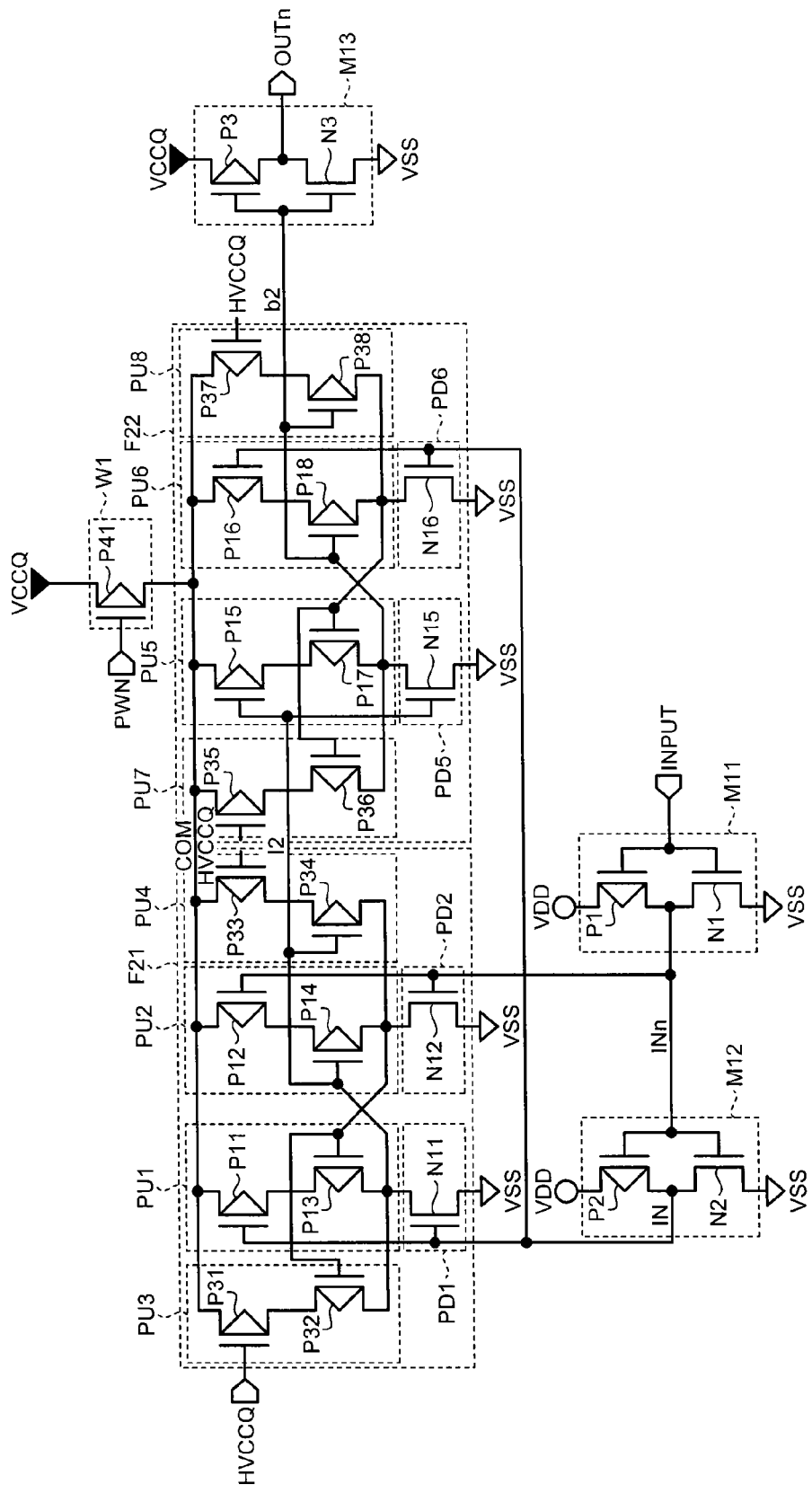
FIG. 11 is a circuit diagram illustrating the schematic structure of a level shift circuit according to a sixth embodiment.

FIG. 11 is a circuit diagram illustrating the schematic structure of a level shift circuit according to a sixth embodiment.

In FIG. 11, the level shift circuit further includes a power-off element W1, as compared to the level shift circuit shown in FIG. 10. The power-off element W1 includes a P-channel field effect transistor P41. The sources of the P-channel field effect transistors P11, P12, P15, P16, P31, P33, P35, and P37 are connected to a common terminal COM. The drain of a P-channel field effect transistor P41 is connected to the common terminal COM. The source of the P-channel field effect transistor P41 is connected to a fifth power supply potential VCCQ. A power-down signal PWN is input to the gate of the P-channel field effect transistor P41.

When the power-down of an external power supply is detected, the power-down signal PWN rises and the P-channel field effect transistor P41 is turned off. In addition, a fourth power supply potential VDD is generated from the external power supply and the fifth power supply potential VCCQ is generated from an internal power supply. Therefore, the level shift units F21 and F22 can be disconnected from the fifth power supply potential VCCQ and it is possible to prevent a shoot-through current from flowing to the level shift circuit when power-down occurs in the external power supply.

Seventh Embodiment

Figure 12:
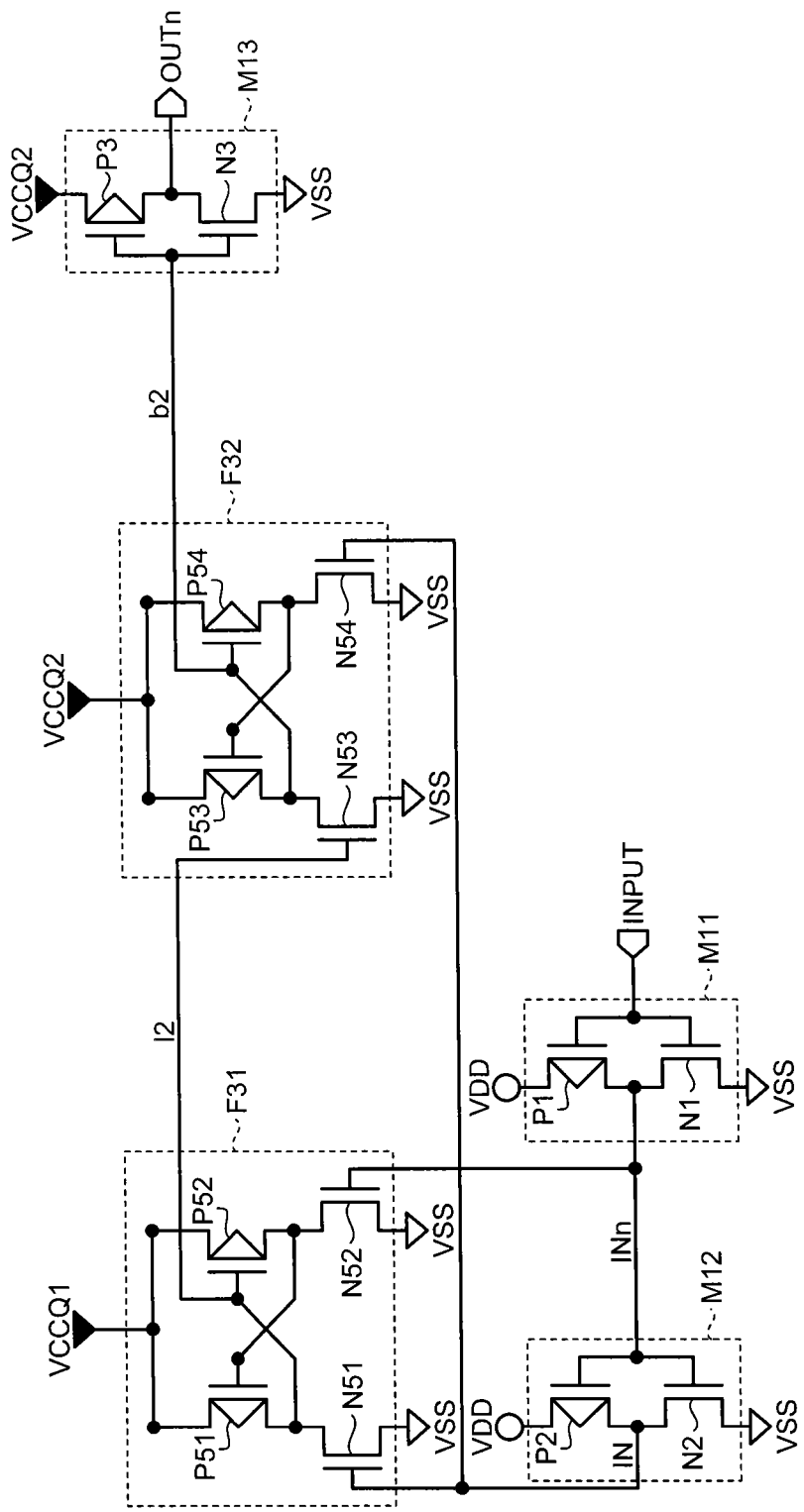
FIG. 12 is a circuit diagram illustrating the schematic structure of a level shift circuit according to a seventh embodiment.

FIG. 12 is a circuit diagram illustrating the schematic structure of a level shift circuit according to a seventh embodiment.

In FIG. 12, the level shift circuit includes level shift units F31 and F32 and the level shift unit F32 is connected to the rear stage of the level shift unit F31. An inverter M12 is connected to the front stage of the level shift units F31 and F32. An inverter M11 is connected to the front stage of the inverter M12. An inverter M13 is connected to the rear stage of the level shift unit F32.

The level shift unit F31 can shift the level of an output voltage between a first power supply potential VSS and a second power supply potential VCCQ1. The level shift unit F32 can shift the level of the output voltage between the first power supply potential VSS and a third power supply potential VCCQ2.

In each of the level shift units F31 and F32, the delay time of the rising edge of the output voltage is different from that of the falling edge of the output voltage. The level shift unit F31 can perform a level shift operation on the basis of input voltages IN and INn. The level shift unit F32 can perform a level shift operation using the input voltage IN to the level shift unit F31 and the output voltage I2 from the level shift unit F31 as differential input voltages.

The level shift unit F31 includes P-channel field effect transistors P51 and P52 and N-channel field effect transistors N51 and N52. The level shift unit F32 includes P-channel field effect transistors P53 and P54 and N-channel field effect transistors N53 and N54.

The sources of the P-channel field effect transistors P51 and P52 are connected to the second power supply potential VCCQ1. The drain of the P-channel field effect transistor P51 is connected to the drain of the N-channel field effect transistor N51. The drain of the P-channel field effect transistor P52 is connected to the drain of the N-channel field effect transistor N52. The sources of the N-channel field effect transistors N51 and N52 are connected to the first power supply potential VSS.

The gate of the N-channel field effect transistor N51 is connected to the drain of the P-channel field effect transistor P2. The gate of the N-channel field effect transistor N52 is connected to the drain of the P-channel field effect transistor P1. The gate of the P-channel field effect transistor P51 is connected to the drain of the P-channel field effect transistor P52. The gate of the P-channel field effect transistor P52 is connected to the drain of the P-channel field effect transistor P51.

The sources of the P-channel field effect transistors P53 and P54 are connected to the third power supply potential VCCQ2. The drain of the P-channel field effect transistor P53 is connected to the drain of the N-channel field effect transistor N53. The drain of the P-channel field effect transistor P54 is connected to the drain of the N-channel field effect transistor N54 and the sources of the N-channel field effect transistors N53 and N54 are connected to the first power supply potential VSS.

The gate of the N-channel field effect transistor N53 is connected to the drain of the P-channel field effect transistor P51 and the gate of the N-channel field effect transistor N54 is connected to the drain of the P-channel field effect transistor P2. The gate of the P-channel field effect transistor P53 is connected to the drain of the P-channel field effect transistor P54 and the gate of the P-channel field effect transistor P54 is connected to the drain of the P-channel field effect transistor P53.

When an input voltage INPUT is input to the inverter M11, the inverter M11 inverts the input voltage INPUT to generate an input voltage INn and outputs the input voltage INn to the inverter M12 and the level shift unit F31.

When the input voltage INn is input to the inverter M12, the inverter M12 inverts the input voltage INn to generate an input voltage IN and outputs the input voltage IN to the level shift unit F31.

The level shift unit F31 performs a level shift operation using the input voltages INn and IN as differential input voltages to generate an output voltage I2 with an amplitude VCCQ1, and the output voltage I2 is input to the level shift unit F32.

The level shift unit F32 performs a level shift operation using the input voltage IN to the level shift unit F31 and the output voltage I2 from the level shift unit F31 as differential input voltages to generate an output voltage b2 with an amplitude VCCQ2, and the output voltage b2 is input to the inverter M13.

The inverter M13 inverts the output voltage b2 from the level shift unit F32 and an output voltage OUTn is output from the inverter M13.

In this way, the delay time of the falling edge of the output voltage I2 from the previous level shift unit F31 can be compensated by the delay time of the rising edge of the output voltage b2 from the next level shift unit F32, and the delay time of the rising edge of the output voltage I2 from the previous level shift unit F31 can be compensated by the delay time of the falling edge of the output voltage b2 from the next level shift unit F32. As a result, it is possible to reduce the deviation of the duty ratio of the output voltage OUTn to the input voltage INPUT, as compared to the deviation of the duty ratio of the output voltage I2 to the input voltage INPUT and prevent a reduction in operation margin.

Eighth Embodiment

Figure 13:
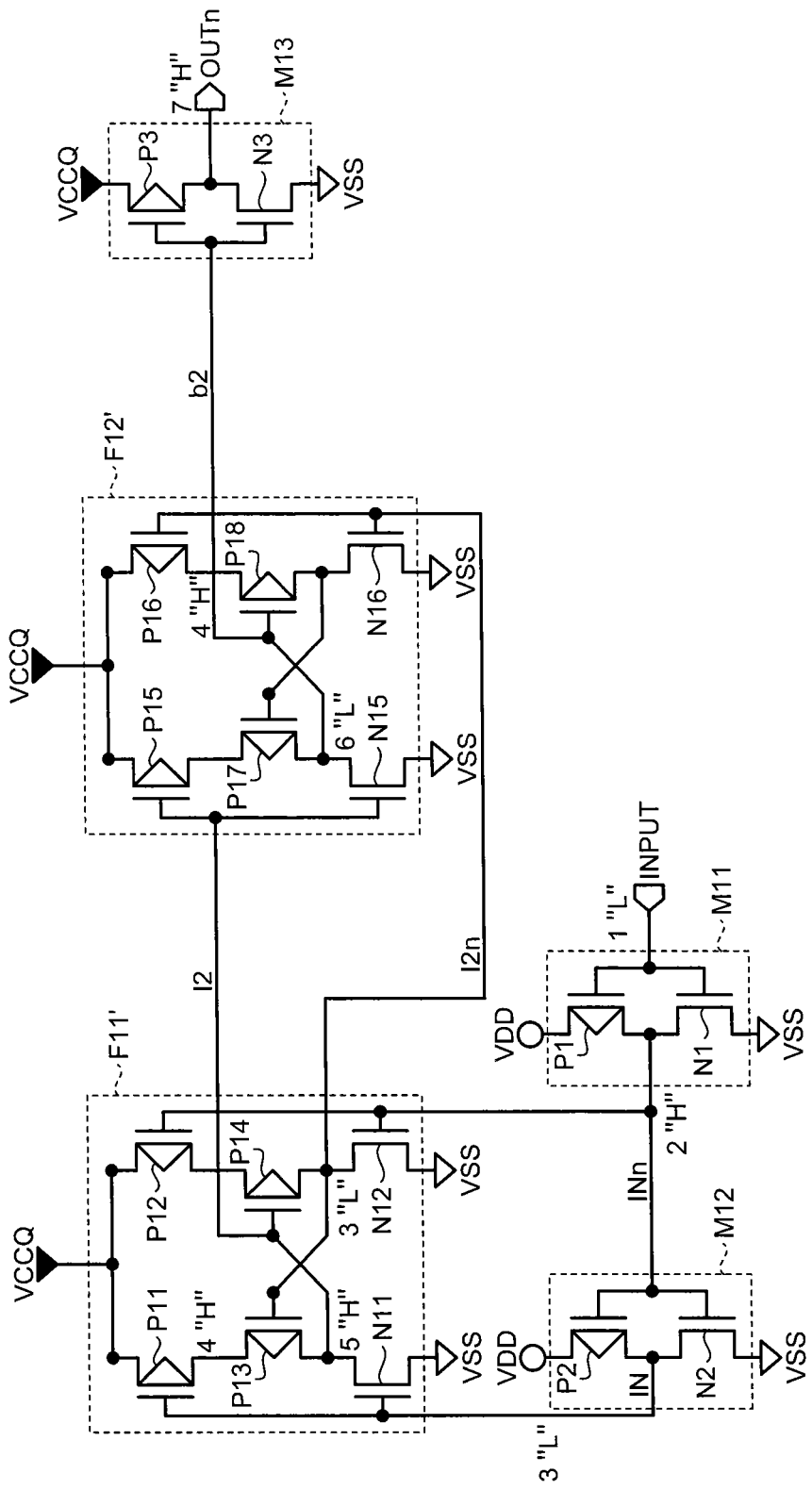
FIG. 13 is a circuit diagram illustrating the delay of each node when an input voltage INPUT to an inverter M11 falls in a level shift circuit according to an eighth embodiment.

FIG. 13 is a circuit diagram illustrating the delay of each node when an input voltage INPUT to an inverter M11 falls in a level shift circuit according to an eighth embodiment. In the example shown in FIG. 13, the delay time corresponding to one transistor is 1 and the delay time of each node is shown together with the level.

In FIG. 13, the level shift circuit includes level shift units F11' and F12', instead of the level shift units F11 and F12 shown in FIG. 2. The level shift units F11' and F12' can shift the level of an output voltage between a first power supply potential VSS and a fifth power supply potential VCCQ.

In each of the level shift units F11' and F12', the delay time of the rising edge of the output voltage is different from that of the falling edge of the output voltage. The level shift unit F11' can perform a level shift operation on the basis of input voltages IN and INn. The level shift unit F12' can perform a level shift operation using output voltages I2 and I2n from the level shift unit F11' as differential input voltages.

In FIG. 2, the sources of the P-channel field effect transistors P11 and P12 of the level shift unit F11 are connected to the second power supply potential VCCQ1. However, in FIG. 13, the sources of the P-channel field effect transistors P11 and P12 of the level shift unit F11' are connected to the fifth power supply potential VCCQ. The structure of the level shift unit F11' shown in FIG. 13 is similar to that of the level shift unit F11 shown in FIG. 2 except for the above.

In FIG. 2, the sources of the P-channel field effect transistors P15 and P16 of the level shift unit F12 are connected to the third power supply potential VCCQ2. However, in FIG. 13, the sources of the P-channel field effect transistors P15 and P16 of the level shift unit F12' are connected to the fifth power supply potential VCCQ. In FIG. 2, the gate of the P-channel field effect transistor P16 and the gate of the N-channel field effect transistor N16 in the level shift unit F12 are connected to the drain of the P-channel field effect transistor P2. However, in FIG. 13, the gate of the P-channel field effect transistor P16 and the gate of the N-channel field effect transistor N16 in the level shift unit F12' are connected to the drain of the P-channel field effect transistor P14. The structure of the level shift unit F12' shown in FIG. 13 is similar to that of the level shift unit F12 shown in FIG. 2 except for the above.

When an input voltage INPUT is at an "L" level and the delay time is 1, the input voltage INn is delayed by a value corresponding to one transistor of the inverter M11 and rises. Therefore, the input voltage INn is at an "H" level and the delay time is 2. When the input voltage INn is at the "H" level, the drain potential of the P-channel field effect transistor P14 is delayed by a value corresponding to one transistor of the level shift unit F11' and falls. Therefore, the drain potential of the P-channel field effect transistor P14 is at an "L" level and the delay time is 3. The P-channel field effect transistor P13 is turned on.

When the input voltage INn is at the "H" level, the input voltage IN is delayed by a value corresponding to one transistor of the inverter M12 and falls. Therefore, the input voltage IN is at an "L" level and the delay time is 3. When the input voltage IN is at the "L" level, the drain potential of the P-channel field effect transistor P11 is delayed by a value corresponding to one transistor of the level shift unit F11' and rises. Therefore, the drain potential of the P-channel field effect transistor P11 is at an "H" level and the delay time is 4. When the P-channel field effect transistor P13 is turned on and the drain potential of the P-channel field effect transistor P11 is at the "H" level, the output voltage I2 is delayed by a value corresponding to one transistor of the level shift unit F11' and rises. Therefore, the output voltage I2 is at an "H" level and the delay time is 5.

When the output voltage I2 is at the "H" level, the output voltage b2 is delayed by a value corresponding to one transistor of the level shift unit F12' and falls. Therefore, the output voltage b2 is at an "L" level and the delay time is 6. When the output voltage b2 is at the "L" level, the output voltage OUTn is delayed by a value corresponding to one transistor of the inverter M13 and rises. Therefore, the output voltage OUTn is at an "H" level and the delay time is 7.

That is, in this case, the P-channel field effect transistor P15 of the level shift unit F12' is turned off and the N-channel field effect transistor N15 thereof is turned on, thereby determining the level of the output voltage b2. Therefore, the states of the P-channel field effect transistor P16 and the N-channel field effect transistor N16 of the level shift unit F12' are not related to the determination of the level of the output voltage. In the level shift circuit shown in FIG. 13, even when the connection destinations of the gate of the P-channel field effect transistor P16 and the gate of the N-channel field effect transistor N16 are different from those in the level shift circuit shown in FIG. 2, the same operation as that of the level shift circuit shown in FIG. 2 is performed.

Figure 14:
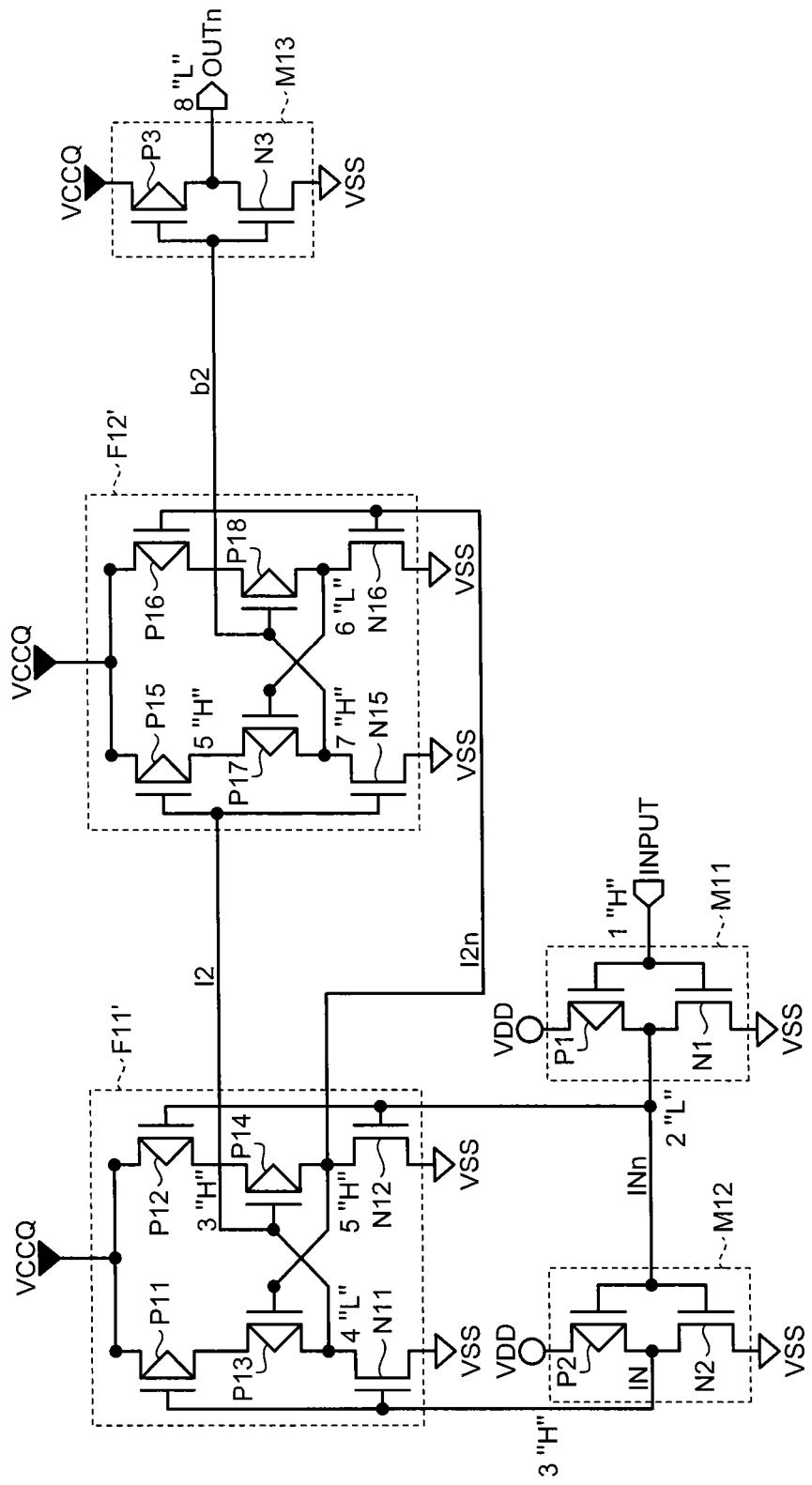
FIG. 14 is a circuit diagram illustrating the delay of each node when the input voltage INPUT to the inverter M11 rises in the level shift circuit shown in FIG. 13.

FIG. 14 is a circuit diagram illustrating the delay of each node when the input voltage INPUT to the inverter M11 rises in the level shift circuit shown in FIG. 13. In the example shown in FIG. 14, the delay time corresponding to one transistor is 1 and the delay time of each node is shown together with the level.

In FIG. 14, when the input voltage INPUT is at an "H" level and the delay time is 1, the input voltage INn is delayed by a value corresponding to one transistor of the inverter M11 and falls. Therefore, the input voltage INn is at an "L" level and the delay time is 2. When the input voltage INn is at the "L" level, the drain potential of the P-channel field effect transistor P12 is delayed by a value corresponding to one transistor of the level shift unit F11' and rises. Therefore, the drain potential of the P-channel field effect transistor P12 is at an "H" level and the delay time is 3.

When the input voltage INn is at the "L" level, the input voltage IN is delayed by a value corresponding to one transistor of the inverter M12 and rises. Therefore, the input voltage IN is at an "H" level and the delay time is 3. When the input voltage IN is at the "H" level, the output voltage I2 is delayed by a value corresponding to one transistor of the level shift unit F11' and falls. Therefore, the output voltage I2 is at an "L" level and the delay time is 4. When the drain potential of the P-channel field effect transistor P12 is at the "H" level and the output voltage I2 is at the "L" level, the drain potential of the P-channel field effect transistor P14 is delayed by a value corresponding to one transistor of the level shift unit F11' and rises. Therefore, the drain potential of the P-channel field effect transistor P14 is at an "H" level and the delay time is 5.

When the output voltage I2 is at the "L" level, the drain potential of the P-channel field effect transistor P15 is delayed by a value corresponding to one transistor of the level shift unit F12' and rises. Therefore, the drain potential of the P-channel field effect transistor P15 is at an "H" level and the delay time is 5.

When the drain potential of the P-channel field effect transistor P14 is at the "H" level, the drain potential of the P-channel field effect transistor P18 is delayed by a value corresponding to one transistor of the level shift unit F12' and falls. Therefore, the drain potential of the P-channel field effect transistor P18 is at an "L" level and the delay time is 6. The P-channel field effect transistor P17 is turned on.

When the drain potential of the P-channel field effect transistor P15 is at the "H" level and the P-channel field effect transistor P17 is turned on, the output voltage b2 is delayed by a value corresponding to one transistor of the level shift unit F12' and rises. Therefore, the output voltage b2 is at an "H" level and the delay time is 7. When the output voltage b2 is at the "H" level, the output voltage OUTn is delayed by a value corresponding to one transistor of the inverter M13 and falls. Therefore, the output voltage OUTn is at an "L" level and the delay time is 8.

Therefore, in the level shift circuit, the time from the rise of the input voltage INPUT to the fall of the output voltage OUTn is delayed by a delay time corresponding to one transistor, as compared to the time from the fall of the input voltage INPUT to the rise of the output voltage OUTn.

The level shift units F11' and F12' with the same amount of level shift are connected in series to each other to compensate the delay time of the falling edge of the output voltage I2 from the previous level shift unit F11' with the delay time of the rising edge of the output voltage b2 from the next level shift unit F12' and compensate the delay time of the rising edge of the output voltage I2 from the previous level shift unit F11' with the delay time of the falling edge of the output voltage b2 from the next level shift unit F12'. Therefore, even when the delay times of the rising edges of the output voltages I2 and b2 are different from the delay times of the falling edges of the output voltages I2 and b2 in each of the level shift units F11' and F12', it is possible to reduce the deviation of the duty ratio of the output voltage OUTn to the input voltage INPUT and prevent a reduction in operation margin.

Ninth Embodiment

Figure 15:
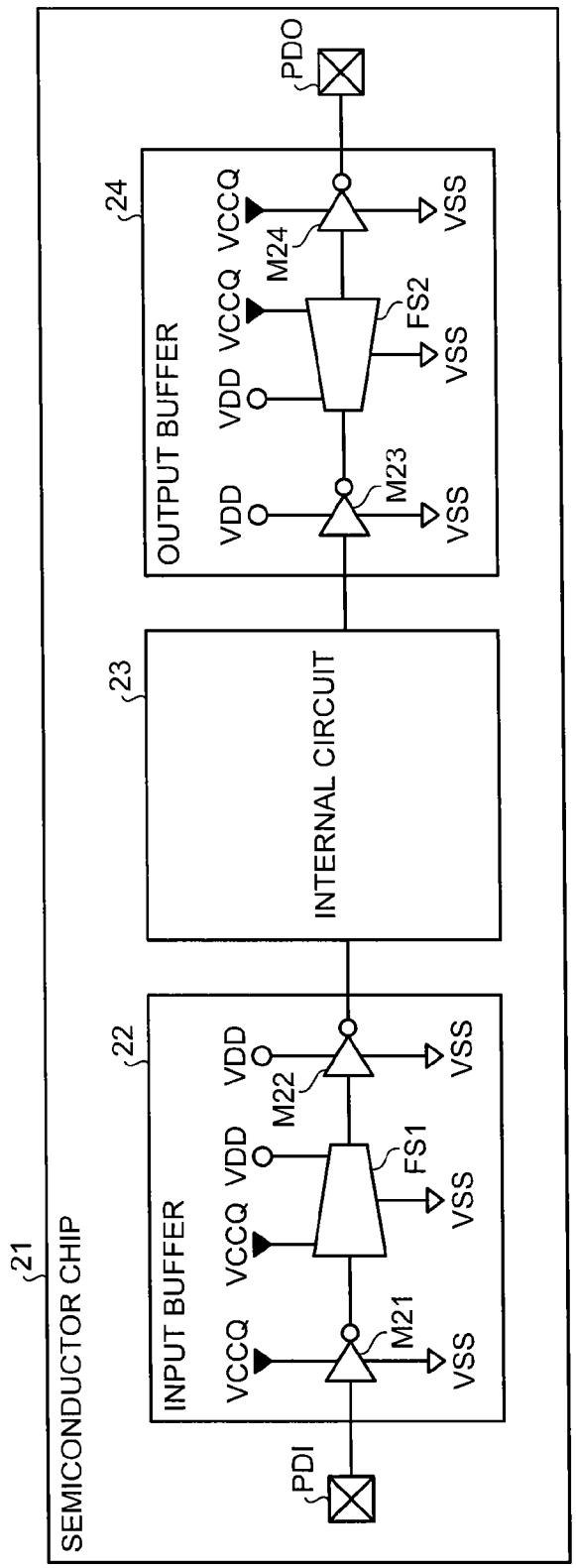
FIG. 15 is a block diagram illustrating the schematic structure of a semiconductor device according to a ninth embodiment to which the level shift circuit is applied.

FIG. 15 is a block diagram illustrating the schematic structure of a semiconductor device according to a ninth embodiment to which a level shift circuit is applied.

In FIG. 15, an input buffer 22, an internal circuit 23, and an output buffer 24 are formed in a semiconductor chip 21. The internal circuit 23 may be a logic circuit, memory, a processor, or an ASIC. The input buffer 22 is connected to the front stage of the internal circuit 23 and the output buffer 24 is connected to the rear stage of the internal circuit 23.

The input buffer 22 includes inverters M21 and M22 and a level shift circuit FS1 and the output buffer 24 includes inverters M23 and M24 and a level shift circuit FS2. The level shift circuits FS1 and FS2 may have any one of the structures shown in FIGS. 1, 2, 6, and 8 and FIGS. 10 to 13.

The inverter M21 is connected to the front stage of the level shift circuit FS1. The inverter M22 is connected to the rear stage of the level shift circuit FS1. A pad electrode PDI is connected to the input of the inverter M21. The internal circuit 23 is connected to the input of the inverter M22. The inverter M23 is connected to the front stage of the level shift circuit FS2. The inverter M24 is connected to the rear stage of the level shift circuit FS2. The internal circuit 23 is connected to the input of the inverter M23. A pad electrode PDO is connected to the output of the inverter M24.

When an input voltage with an amplitude VCCQ is input to the pad electrode PDI, the inverter M21 inverts the input voltage and the inverted input voltage is input to the level shift circuit FS1. Then, in the level shift circuit FS1, a level shift from the input voltage with the amplitude VCCQ to an output voltage with an amplitude VDD is performed and the output voltage is inverted by the inverter M22 and is then input to the internal circuit 23.

When the output voltage with the amplitude VDD is output from the internal circuit 23, the inverter M23 inverts the output voltage and the inverted output voltage is input to the level shift circuit FS2. Then, in the level shift circuit FS2, a level shift from the output voltage with the amplitude VDD to an output voltage with an amplitude VCCQ is performed and the output voltage is inverted by the inverter M24 and is then output through the pad electrode PDO.

When VCCQ>VDD is satisfied, the internal circuit 23 can operate at the internal voltage lower than the external power supply voltage. On the other hand, when VCCQ<VDD is satisfied, the internal circuit 23 can be operated at the internal voltage higher than the external power supply voltage and it is possible to increase the operation speed.

Since the level shift circuits FS1 and FS2 have any one of the structures shown in FIGS. 1, 2, 6, and 8 and FIGS. 10 to 13, it is possible to reduce the deviation of the duty ratio of the output voltage and prevent a reduction in the operation margin of the internal circuit 23.

Tenth Embodiment

FIG. 16A is a block diagram illustrating the schematic structure of a semiconductor memory device to which a level shift circuit according to a tenth embodiment is applied. FIG. 16B is a perspective view illustrating the schematic structure of a NAND memory 3-1 shown in 16A. FIG. 16C is a perspective view illustrating the schematic structure of a semiconductor chip CP1 of the NAND memory 3-1 shown in FIG. 16B.

In FIGS. 16A to 16C, the semiconductor memory device includes n (n is an integer equal to or greater than 2) NAND memories 3-1 to 3-n and a controller 1 that controls the driving of the NAND memories 3-1 to 3-n. Examples of the control of the driving of the NAND memories 3-1 to 3-n may include the control of the reading and writing of the NAND memories 3-1 to 3-n, block selection, error correction, and wear leveling.

The NAND memories 3-1 to 3-n are connected in parallel to the controller 1 through a channel 2. For example, the NAND memory 3-1 includes m (m is an integer equal to or greater than 2) semiconductor chips CP1 to CPm and each of the semiconductor chips CP1 to CPm includes a NAND flash memory 13 and pad electrodes PD1 to PDm connected to the NAND flash memory 13. The NAND flash memory 13 may include, for example, a unit cell array, a decoder, a sense amplifier, a charge pump circuit, and a page buffer.

Each of the semiconductor chips CP1 to CPm includes an input buffer 11, an output buffer 12, and a programmable ROM 14. The input buffer 11 can transmit control signals, such as written data or an address, transmitted from the controller 1 to the NAND flash memory 13. The output buffer 12 can transmit data read from, for example, the NAND flash memory 13 to the controller 1.

The input buffer 22 shown in FIG. 15 may be used as the input buffer 11. The input buffer 24 shown in FIG. 15 may be used as the output buffer 12. In this case, the power supply voltage of the NAND flash memory 13 may be set to VDD and the power supply voltage of the controller 1 may be set to VCCQ.

The programmable ROM 14 stores various parameters related to the operations of the input buffer 11, the output buffer 12, and the NAND flash memory 13. For example, when the level shift circuits of the input buffer 11 and the output buffer 12 have the structure shown in FIG. 6, parameters for switching the source and drain of the P-channel field effect transistor P21 between the first power supply potential VSS and the second power supply potential VCCQ1 may be stored, and parameters for switching the source and drain of the N-channel field effect transistor N21 between the first power supply potential VSS and the second power supply potential VCCQ1 may be stored.

The m semiconductor chips CP1 to CPm are mounted on one semiconductor package PK1 and an external terminal TM of the semiconductor package PK1 is shared by the pad electrodes PD1 to PDm of the m semiconductor chips CP1 to CPm. As a method of mounting the semiconductor chips CP1 to CPm on the semiconductor package PK1, the following methods may be used: a method of laminating the semiconductor chips CP1 to CPm; and a method of arranging the semiconductor chips CP1 to CPm on the same plane. In addition, the semiconductor chips CP1 to CPm may be mounted face down or face up. As a method of sharing one external terminal TM among the m pad electrodes PD1 to PDm, the m pad electrodes PD1 to PDm and the one external terminal TM may be connected to each other by bonding wires BW. Alternatively, the semiconductor chips CP1 to CPm may be mounted by flip chip technology, and the pad electrodes PD1 to PDm and the external terminal TM may be connected to each other through bump electrodes form on the pad electrodes PD1 to PDm. Alternatively, through electrodes may be formed in the semiconductor chips CP1 to CPm and the pad electrodes PD1 to PDm and the external terminal TM may be connected to each other through the through electrodes. This holds for the NAND memories 3-2 to 3-n other than the NAND memory 3-1. In addition, the semiconductor memory device may be used as a storage device, such as a memory card or an SSD.

Figure 17:
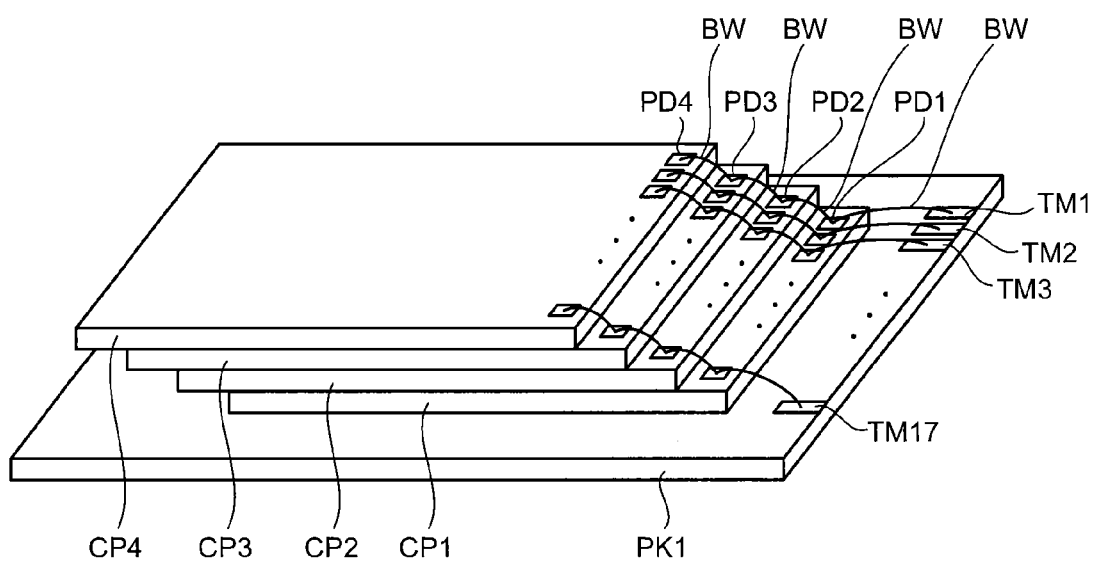
FIG. 17 is a perspective view illustrating an example of the schematic structure of the NAND memory 3-1 shown in FIG. 16A.

FIG. 17 is a perspective view illustrating an example of the schematic structure of the NAND memory 3-1 shown in FIG. 16A. In the example shown in FIG. 17, m is 4.

In FIG. 17, the pad electrodes PD1 to PD4 are formed in the semiconductor chips CP1 to CP4, respectively. The pad electrodes PD1 to PD4 may be used as, for example, address terminals, reading/writing terminals, chip selection terminals, or data terminals. External terminals TM1 to TM17 are formed in the semiconductor package PK1. When four semiconductor chips CP1 to CP4 are laminated and mounted on the semiconductor package PK1, the semiconductor chips CP1 to CP4 may be laminated so as to deviate from each other such that the pad electrodes PD1 to PD4 are exposed. Then, for example, the pad electrodes PD1 to PD4 may be connected to the common external terminal TM1 by the bonding wires BW. In this way, the pad electrodes PD1 to PD4 of the four semiconductor chips CP1 to CP4 can share one external terminal TM1.

Eleventh Embodiment

Figure 18:
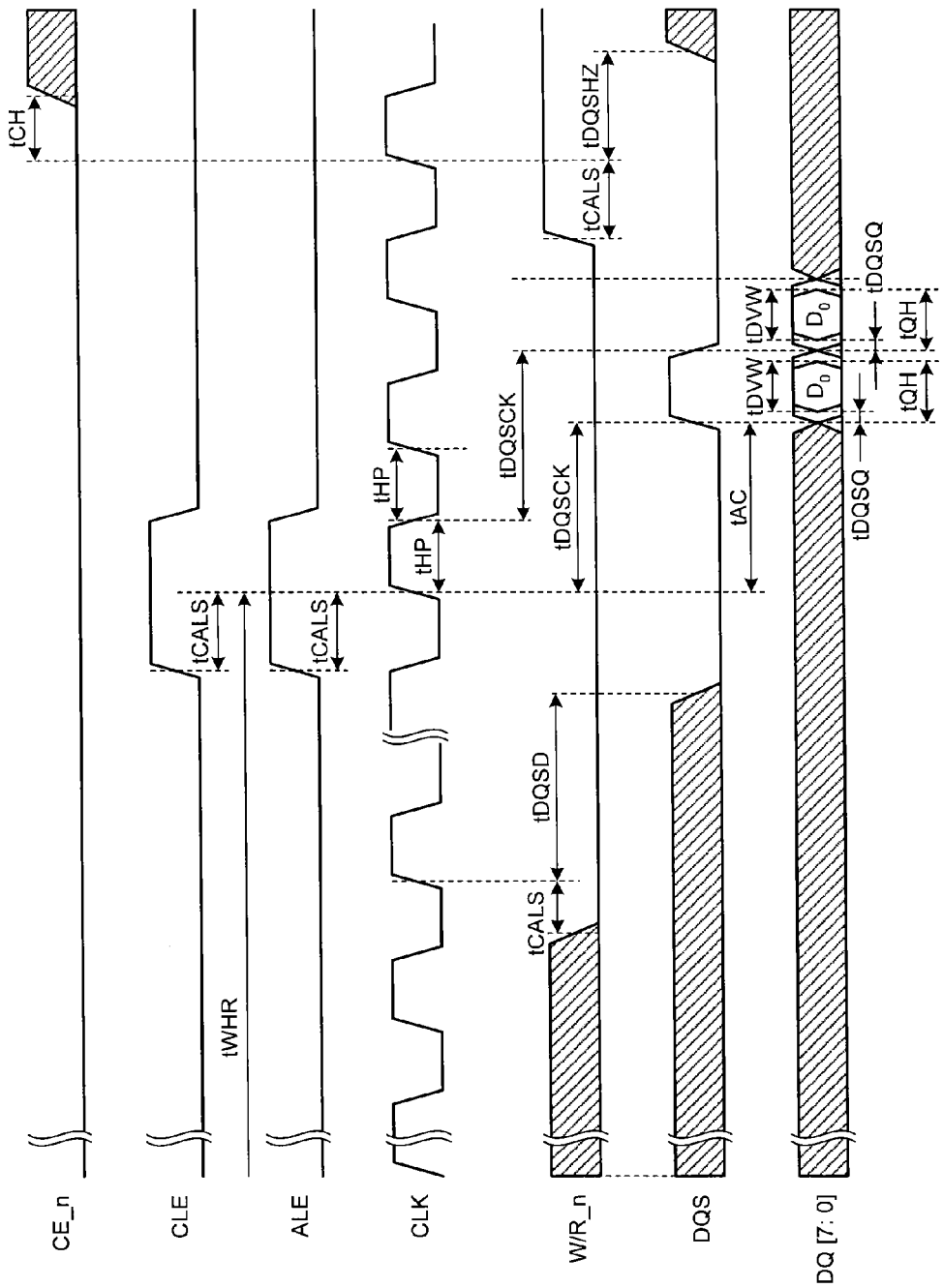
FIG. 18 is a timing chart illustrating the operation of a semiconductor memory device according to an eleventh embodiment to which the level shift circuit is applied in the toggle mode.

FIG. 18 is a timing chart illustrating the operation of a semiconductor memory device according to an eleventh embodiment to which a level shift circuit is applied in the toggle mode.

In FIG. 18, the controller 1 shown in FIG. 16 outputs a chip enable signal CE_n, a command latch enable signal CLE, an address latch enable signal ALE, a clock signal CLK, a read/write signal W/R_n, a data strobe signal DQS, and data DQ[7:0].

The data strobe signal DQS indicates the time when the data DQ[7:0] is acquired and the timing of the data strobe signal DQS and the data DQ[7:0] is set on the basis of the clock signal CLK. In the controller shown in FIG. 16, a command and an address are output as the data DQ[7:0], the data DQ[7:0] when the command latch enable signal CLE is activated is considered as the command, and the data DQ[7:0] when the address latch enable signal ALE is activated is considered as the address.

In the toggle mode, when the command latch enable signal CLE and the address latch enable signal ALE are inactivated, the data DQ[7:0] is acquired at both the rising edge and the falling edge of the data strobe signal DQS.

In FIG. 18, tCH is a CE_n hold time, tWHR is a command, an address, or a data input cycle to a data output cycle, tCALS is a W/R_n, CLE, and ALE setup time, tHP is a half-clock period, tDQSD is W/R_n low to DQS/DQ driven by device, tDQSCK is an access window of DQS from CLK, tDQSHZ is W/Rn high to DQS/DQ tri-state by device, tAC is an access window of DQ[7:0] from CLK, tDVW is an output data valid window, tDQSQ is DQS-DQ skew, DQS to last DQ valid, per access, and tQH is DQ-DQS hold, DQS to first DQ to go non-valid, per access.

The controller 1 shown in FIG. 16 sets the amplitudes of the chip enable signal CE_n, the command latch enable signal CLE, the address latch enable signal ALE, the clock signal CLK, the read/write signal W/R_n, and the data strobe signal DQS and data DQ[7:0] to VCCQ.

The level shift circuit of the input buffer 11 shifts the level of the signal from the controller 1 to an amplitude VDD and the level-shifted signal is input to the NAND flash memory 13. At that time, the NAND flash memory 13 shown in FIG. 16 sets the amplitudes of the chip enable signal CE_n, the command latch enable signal CLE, the address latch enable signal ALE, the clock signal CLK, the read/write signal W/R_n, the data strobe signal DQS, and the data DQ[7:0] to VDD. The level shift circuit of the output buffer 12 shifts the level of the signal from the NAND flash memory 13 to an amplitude VCCQ and the level-shifted signal is input to the controller 1.

Since the level shift circuits of the input buffer 11 and the output buffer 12 have any one of the structures shown in FIGS. 1, 2, 6, and 8 and FIGS. 10 to 13, it is possible to reduce the deviation of the duty ratio of the output voltage. Therefore, it is possible to reduce the deviation of tDVW during a level shift operation and prevent a reduction in operation margin.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A level shift circuit comprising:
   a plurality of level shift units which are connected to each other and in which the delay time of a rising edge of an output voltage is different from the delay time of a falling edge of the output voltage,
   wherein the delay time of the rising edge of the output voltage from a previous level shift unit is compensated by the delay time of the falling edge of the output voltage from the next level shift unit, and
   the delay time of the falling edge of the output voltage from the previous level shift unit is compensated by the delay time of the rising edge of the output voltage from the next level shift unit; and
   wherein the plurality of level shift units comprising:
      a first level shift unit that performs a level shift operation on the basis of a differential input voltage; and
      a second level shift unit that performs a level shift operation using an input voltage to the first level shift unit and an output voltage from the first level shift unit as differential input voltages.

2. The level shift circuit according to claim 1, further comprising:
   a capacitive element that is connected to an output side of one of the plurality of level shift units.

3. The level shift circuit according to claim 1,
   wherein the level shift unit includes:
   a pull-down element that pulls down the output voltage to a first power supply potential;
   a first pull-up element that is connected in series to the pull-down element and pulls up the output voltage to a second power supply potential; and
   a second pull-up element that is connected in parallel to the first pull-up element and performs a pull-up operation on the basis of the second power supply potential.

4. The level shift circuit according to claim 1, further comprising:
   a power-off element that turns off a power supply for the level shift circuit when the power-down of an external power supply is detected.

5. The level shift circuit according to claim 1,
   wherein the delay time of the rising edge of the output voltage from the first level shift unit is more than that of the falling edge of the output voltage from the first level shift unit and the delay time of the rising edge of an output voltage from the second level shift unit is more than that of the falling edge of the output voltage from the second level shift unit,
   the falling edge of the output voltage from the first level shift unit is generated according to the rising edge of the input voltage to the first level shift unit and the rising edge of the output voltage from the first level shift unit is generated according to the falling edge of the input voltage to the first level shift unit, and
   the rising edge of the output voltage from the second level shift unit is generated according to the falling edge of the input voltage to the second level shift unit and the falling edge of the output voltage from the second level shift unit is generated according to the rising edge of the input voltage to the second level shift unit.

6. The level shift circuit according to claim 1,
   wherein the first level shift unit performs the level shift operation between a first power supply potential and a second power supply potential, and the second level shift unit performs the level shift operation between the first power supply potential and a third power supply potential.

7. The level shift circuit according to claim 6,
   wherein the first level shift unit includes:
   a first P-channel field effect transistor;
   a second P-channel field effect transistor;
   a first N-channel field effect transistor that includes a gate connected to a gate of the first P-channel field effect transistor;
   a second N-channel field effect transistor that includes a gate connected to a gate of the second P-channel field effect transistor;
   a third P-channel field effect transistor that is connected in series between the first P-channel field effect transistor and the first N-channel field effect transistor; and
   a fourth P-channel field effect transistor that is connected in series between the second P-channel field effect transistor and the second N-channel field effect transistor,
   the second level shift unit includes:
   a fifth P-channel field effect transistor;
   a sixth P-channel field effect transistor;

a third N-channel field effect transistor that includes a gate connected to a gate of the fifth P-channel field effect transistor;

a fourth N-channel field effect transistor that includes a gate connected to a gate of the sixth P-channel field effect transistor;

a seventh P-channel field effect transistor that is connected in series between the fifth P-channel field effect transistor and the third N-channel field effect transistor; and an eighth P-channel field effect transistor that is connected in series between the sixth P-channel field effect transistor and the fourth N-channel field effect transistor, a gate of the third P-channel field effect transistor is connected to a connection point between the fourth P-channel field effect transistor and the second N-channel field effect transistor, a gate of the fourth P-channel field effect transistor is connected to a connection point between the third P-channel field effect transistor and the first N-channel field effect transistor, a gate of the seventh P-channel field effect transistor is connected to a connection point between the eighth P-channel field effect transistor and the fourth N-channel field effect transistor, a gate of the eighth P-channel field effect transistor is connected to a connection point between the seventh P-channel field effect transistor and the third N-channel field effect transistor, the input voltage is applied to the gates of the first and fifth P-channel field effect transistors and the gates of the first and third N-channel field effect transistors, an inverted voltage of the input voltage is applied to the gate of the second P-channel field effect transistor and the gate of the second N-channel field effect transistor, and the output voltage from the first level shift unit is applied to the gate of the sixth P-channel field effect transistor and the gate of the fourth N-channel field effect transistor.

8. The level shift circuit according to claim 6,
wherein the first level shift unit includes:
a first P-channel field effect transistor;
a second P-channel field effect transistor;
a first N-channel field effect transistor that is connected in series to the first P-channel field effect transistor; and
a second N-channel field effect transistor that is connected in series to the second P-channel field effect transistor,
the second level shift unit includes:
a third P-channel field effect transistor;
a fourth P-channel field effect transistor;
a third N-channel field effect transistor that is connected in series to the third P-channel field effect transistor; and
a fourth N-channel field effect transistor that is connected in series to the fourth P-channel field effect transistor,
a gate of the first P-channel field effect transistor is connected to a connection point between the second P-channel field effect transistor and the second N-channel field effect transistor,
a gate of the second P-channel field effect transistor is connected to a connection point between the first P-channel field effect transistor and the first N-channel field effect transistor,
the input voltage is applied to gates of the first and fourth N-channel field effect transistors,
an inverted voltage of the input voltage is applied to a gate of the second N-channel field effect transistor, and
the output voltage from the first level shift unit is applied to a gate of the third N-channel field effect transistor.

9. The level shift circuit according to claim 6, further comprising:
a first capacitive element that is connected to an output side of the first level shift unit; and
a second capacitive element that is connected to the output side of the first level shift unit.

10. The level shift circuit according to claim 9,
wherein the first capacitive element includes a P-channel field effect transistor that includes a source and a drain connected to the second power supply potential and a gate connected to the output side of the first level shift unit, and
the second capacitive element includes an N-channel field effect transistor that includes a source and a drain connected to the first power supply potential and a gate connected to the output side of the first level shift unit.

11. The level shift circuit according to claim 6, further comprising:
a first capacitive element that is connected to an output side of the second level shift unit; and
a second capacitive element that is connected to the output side of the second level shift unit.

12. The level shift circuit according to claim 11,
wherein the first capacitive element includes a P-channel field effect transistor that includes a source and a drain connected to the third power supply potential and a gate connected to the output side of the second level shift unit, and
the second capacitive element includes an N-channel field effect transistor that includes a source and a drain connected to the first power supply potential and a gate connected to the output side of the second level shift unit.

13. The level shift circuit according to claim 1, further comprising:
a first capacitive element including a P-channel field effect transistor; and
a second capacitive element including an N-channel field effect transistor,
wherein a gate of the P-channel field effect transistor is connected to an output side of the first level shift unit or an output side of the second level shift unit,
a gate of the N-channel field effect transistor is connected to the output side of the first level shift unit or the output side of the second level shift unit, and
the potentials of a source and a drain of the P-channel field effect transistor are controlled by an output of a CMOS circuit, and the potentials of a source and a drain of the N-channel field effect transistor are controlled by an output with a polarity opposite to that of the output of the CMOS circuit.

14. The level shift circuit according to claim 13,
wherein an input of the CMOS circuit is set by a register value or ROM fuse data.

15. The level shift circuit according to claim 13,
wherein a plurality of the P-channel field effect transistors and a plurality of the N-channel field effect transistors are provided, and
the potentials of the source and drain of the P-channel field effect transistors and the potentials of the source and drain of the N-channel field effect transistors are individually controlled.

16. A level shift circuit comprising:
a plurality of level shift units which are connected to each other and in which the delay time of a rising edge of an output voltage is different from the delay time of a falling edge of the output voltage, wherein the delay time of the rising edge of the output voltage from a previous level shift unit is compensated by the delay time of the falling edge of the output voltage from the next level shift unit, and the delay time of the falling edge of the output voltage from the previous level shift unit is compensated by the delay time of the rising edge of the output voltage from the next level shift unit, wherein the plurality of level shift units comprising:

a first level shift unit that performs a level shift operation between a first power supply potential and a second power supply potential; and a second level shift unit that is connected to a rear stage of the first level shift unit and performs a level shift operation between the first power supply potential and the second power supply potential; and wherein the first level shift unit includes:

a first P-channel field effect transistor;

a second P-channel field effect transistor;

a first N-channel field effect transistor that includes a gate connected to a gate of the first P-channel field effect transistor;

a second N-channel field effect transistor that includes a gate connected to a gate of the second P-channel field effect transistor;

a third P-channel field effect transistor that is connected in series between the first P-channel field effect transistor and the first N-channel field effect transistor; and a fourth P-channel field effect transistor that is connected in series between the second P-channel field effect transistor and the second N-channel field effect transistor, the second level shift unit includes:

a fifth P-channel field effect transistor;

a sixth P-channel field effect transistor;

a third N-channel field effect transistor that includes a gate connected to a gate of the fifth P-channel field effect transistor;

a fourth N-channel field effect transistor that includes a gate connected to a gate of the sixth P-channel field effect transistor;

a seventh P-channel field effect transistor that is connected in series between the fifth P-channel field effect transistor and the third N-channel field effect transistor; and an eighth P-channel field effect transistor that is connected in series between the sixth P-channel field effect transistor and the fourth N-channel field effect transistor, a gate of the third P-channel field effect transistor is connected to a connection point between the fourth P-channel field effect transistor and the second N-channel field effect transistor, a gate of the fourth P-channel field effect transistor is connected to a connection point between the third P-channel field effect transistor and the first N-channel field effect transistor, a gate of the seventh P-channel field effect transistor is connected to a connection point between the eighth P-channel field effect transistor and the fourth N-channel field effect transistor, a gate of the eighth P-channel field effect transistor is connected to a connection point between the seventh P-channel field effect transistor and the third N-channel field effect transistor, an input voltage is applied to the gate of the first P-channel field effect transistor and the gate of the first N-channel field effect transistor, an inverted voltage of the input voltage is applied to the gate of the second P-channel field effect transistor and the gate of the second N-channel field effect transistor, the gate of the fifth P-channel field effect transistor and the gate of the third N-channel field effect transistor are connected to the gate of the fourth P-channel field effect transistor, and the gate of the sixth P-channel field effect transistor and the gate of the fourth N-channel field effect transistor are connected to the gate of the third P-channel field effect transistor.

17. The level shift circuit according to claim 1, wherein a NAND flash memory is provided in an internal circuit to which the level shift circuit is connected.

18. The level shift circuit according to claim 17, wherein a controller that operates the NAND flash memory in a toggle mode is provided.

\* \* \* \* \*